PLATED THROUGH HOLE PRINTED CIRCUIT BOARDS

Filed March 27, 1969 17 Sheets-Sheet 1

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

March 26, 1974 F. W. SCHNEBLE, JR., ET AL 3,799,802

PLATED THROUGH HOLE PRINTED CIRCUIT BOARDS

Filed March 27, 1969 17 Sheets-Sheet 6

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

PLATED THROUGH HOLE PRINTED CIRCUIT BOARDS

Filed March 27, 1969 17 Sheets-Sheet 13

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS.
FREDERICK W. SCHNEBLE, JR.
JOHN F. McCORMACK
RUDOLPH J. ZEBLISKY
JOHN DUFF WILLIAMSON
JOSEPH POLICHETTE

INVENTORS,
FREDERICK W. SCHNEBLE, JR.
JOHN F. McCORMACK
RUDOLPH J. ZEBLISKY
JOHN DUFF WILLIAMSON
JOSEPH POLICHETTE
BY
MORGAN, FINNEGAN, DURHAM & PINE
ATTORNEYS

March 26, 1974 F. W. SCHNEBLE, JR., ET AL 3,799,802

PLATED THROUGH HOLE PRINTFD CIRCUIT BOARDS

Filed March 27, 1969 17 Sheets-Sheet 17

INVENTORS,
FREDERICK W. SCHNEBLE, JR.
JOHN F. McCORMACK
RUDOLPH J. ZEBLISKY
JOHN DUFF WILLIAMSON
JOSEPH POLICHETTE
BY
MORGAN, FINNEGAN, DURHAM & PINE
ATTORNEYS 3,799,802

PLATED THROUGH HOLE PRINTED CIRCUIT BOARDS

Frederick W. Schneble, Jr., 16 Karen Court, Oyster Bay, N.Y. 11771; John F. McCormack, 116 Milburn Lane, Roslyn Heights, N.Y. 11577; Rudolph J. Zeblisky, 41 Glenwood Drive, Hauppauge, N.Y. 11787; John Duff Williamson, Box 364–A, Radio Ave., Miller Place, N.Y. 11764; and Joseph Polichette, 9 Hitchcock Lane, South Farmingdale, N.Y. 11735

Continuation-in-part of applications Ser. No. 561,123, June 28, 1966, Ser. No. 598,444, Dec. 1, 1966, and Ser. No. 701,817, Jan. 29, 1968. This application Mar. 27, 1969, Ser. No. 811,142
Int. Cl. H05k *3/00;* B41m *3/08*
U.S. Cl. 117—212 7 Claims

ABSTRACT OF THE DISCLOSURE

Plated through hole circuit boards include a non-registered insulating solder mask superimposed on a circuit pattern conductor carried by an insulating base, a hole extending through the mask and the conductor and into the base, and a continuous metal deposit on the wall of the hole extending from the base interior to the surface of the insulating mask and bridging the conductor.

This application is a continuation-in-part of applications Ser. No. 701,817, filed Jan. 29, 1968, Ser. No. 561,123, filed June 28, 1966 and Ser. No. 598,444, filed Dec. 1, 1966, each of which now is abandoned.

The foregoing three applications in turn disclose subject matter contained in:

Ser. No. 218,656, filed Aug. 22, 1962, now U.S. Pat. No. 3,259,559, issued July 5, 1966, which in turn discloses subject matter contained in co-pending application Ser. No. 785,703, filed Jan. 8, 1959, and now abandoned;

Ser. No. 33,361, filed May 31, 1960, now U.S. Pat. No. 3,146,125, issued Aug. 25, 1964 which in turn discloses subject matter contained in Ser. No. 831,407, filed Aug. 3, 1959, and now abandoned; and Ser. No. 26,401, filed May 3, 1960, and now U.S. Pat. 3,095,309 issued June 25, 1963.

This invention relates to new and useful plated through hole printed circuit boards and more particularly to plated through hole printed circuit boards having highly reliable solder joints.

SUMMARY

According to this invention, a non-registered solder mask is used in the manufacture of plated through hole printed circuit boards with many ensuing advantages.

Heretofore, in producing circuit boards which have a high circuit density per unit area, difficulty has been experienced due to the fact that the holes in such boards: (1) tend to have an extremely small diameter; and (2) tend to be extremely closely spaced, at least in some portions of the circuitry. In conventional practice, a plated through hole board is formed with a circuit on one or more exposed surfaces, and then a registered solder mask is printed over the circuit pattern to leave holes and lands or pads (i.e., small areas on the surface surrounding the holes) exposed. Subsequently, the circuit is solder plated as by dipping in a solder bath to plate solder on the lands and in the holes. The mask protects the major portion of the circuit from the solder and thus guards against short circuiting by the solder of the conductor lines making up the circuit pattern.

In such conventional circuits, the lands or pads are exposed while conductor lines making up the conductor pattern or patterns are protected by the solder mask. Accordingly, when the circuit density is high, it is extremely difficult to print a registered solder mask so as to provide exposed land or pad areas surrounding the holes without some soldering mask accidentally lodging on the barrel of the holes.

Conventional registered, printed solder masks have other disadvantages. Thus, even when great precautions are taken in printing the solder mask on high density circuit boards of the type described, there is a good possibility of the masks breaking down in part, thereby causing the solder to bridge from one land to another, or from one conductor line to another, which in turn results in short circuiting of the finished board. Because to maintain fine printing tolerances in such boards dangerously thin prints are used, the solder mask tends to block the holes, thereby preventing proper soldering.

According to this invention, there are provided plated through hole printed circuit boards which are protected from solder bridging during assembly and re-working by a non-registered, permanent or temporary solder mask.

In a preferred embodiment, the boards of this invention are characterized by plated through holes capable of forming highly reliable solder joints. The plated through holes comprise lands or pads spaced from the plane of the conductor line or lines making up the circuit pattern, at least some of which are in electrical contact with the plated holes.

DETAILED DESCRIPTION

An object of this invention is to make rugged, durable and reliable plated through hole printed circuit boards.

A further object of this invention is to make printed circuit boards, including one-layer, two-layer and multi-layer boards, which are protected from solder bridging during assembly and re-work by a non-registered solder mask.

A further object of this invention is to provide printed circuit boards, including one-layer, two-layer and multi-layer boards, which are provided with conductive passageways capable of forming reliable joints with the printed conductor lines of the circuit pattern.

An additional object of this invention is to provide printed circuit boards, including high density one-layer, two-layer and multi-layer boards, which are provided with conductive passageways, or, as more commonly referred to, plated through holes, characterized by exposed pads surrounding the holes which are non-planar with the conductor line or lines in electrical contact with the holes.

Still a further object of this invention is to provide printed circuit boards having plated through holes capable of forming reliable solder joints whose conductors are protected from solder bridging during assembly and re-work by a non-printed, permanent or temporary solder mask and whose holes comprise pads which are non-planar with the conductor line or lines in electrical contact with the holes.

Other objects and advantages of the invention will be set forth in part herein and in part will be obvious herefrom or may be learned by practice with the invention, the same being realized and attained by means of the instrumentalities and combinations pointed out in the appended claims.

As will be clear from the following description, preferred for use in the manufacture of the circuit boards of this invention are certain catalytic blanks and compositions which are inherently receptive to the deposition of electroless metal and which therefore eliminate the need for conventional seeding and/or sensitizing solutions, thereby avoiding the problems concomitant with the use of such solutions. Use of the catalytic blanks and compositions of this invention insures a strong bond between the laminate foil bonded to the catalytic blank and electroless metal deposited on the foil, e.g., on foil edges exposed on walls surrounding holes, since no intermediate seeder layer is present to interfere with the bond. Also important is the fact that use of these catalytic blanks and compositions leads to the achievement of uniformly high bond strengths between the insulating substratum itself and the electroless metal deposit on, for example, the insulating portion or portions on walls surrounding holes.

Although the catalytic base for the printed circuit boards may take a variety of forms as will be made clear hereinafter, in its preferred embodiment, which will be used to describe the invention, it comprises a resinous material which is catalytic throughout its interior to the reception of electroless metal.

The term "catalytic base" as used herein generically refers to any insulating material which is catalytic to the reception of electroless metal, regardless of shape or thickness, and includes thin films and strips as well as thick substrata. The term "catalytic adhesive," also used herein, refers to an insulating resinous material with adhesive capability which is catalytic to the reception of electroless metal.

The catalytic bases and catalytic adhesives referred to herein are compositions which comprise an agent which is catalytic to the reception of electroless metal, i.e., an agent which is capable of reducing the metal ions in an electroless metal deposition solution to metal.

Conductive materials, i.e., metals, may be used as the catalytic agent. Preferred catalytic agents are metals selected from Groups VIII and I–B of the Periodic Table of Elements, such as nickel, gold, silver, platinum, palladium, rhodium, copper and iridium. Compounds of such metals, including salts and oxides thereof, may also be used.

Typical formulations for catalytic insulating adhesives and catalytic insulating bases suitable for use herein are given in U.S. Pats. 3,259,559 and 3,226,256, the specifications of which are hereby incorporated herein by reference.

Preferred catalytic agents for dissolution in, dispersion in, chemical reaction with, or complexing with inorganic or organic materials to render such material catalytic are the metals of Groups VIII and I–B of the Periodic Table of Elements, or salts or oxides thereof, such as chlorides, bromides, fluorides, ethyl acetoacetates, fluoroborates, iodides, nitrates, sulfates, acetates, and oxides of such metals. Especially useful are palladium, gold, platinum, copper, palladium chloride, gold chloride, platinum chloride and copper oxide alone or in combination with stannous chloride.

The catalytic agent, depending upon type, will be present in amounts varying from a small fraction, e.g., 0.0005 to about 80%, usually between about 0.1 to 10%, based upon the combined weight of carrier material and catalyst. The particular concentration used will depend to a large extent upon the material used.

The catalytic insulating bases may be prepared by dissolving or dispersing the catalytic agent in an insulating material which may in turn be formed into a three-dimensional object, as by molding. The resulting article is catalytic throughout its interior to the reception of electroless metal, so that when holes or apertures are formed in the three-dimensional object, the surrounding walls of the holes are also catalytic. Thus, when such an article containing apertures extending below the surface is contacted with an electroless metal deposition solution, as by immersion therein, electroless metal deposits on the walls surrounding the apertures, and can be built up to any desired thickness.

The surface of the insulating catalytic base may or may not be catalytic, depending upon how it is made. The surface could be made catalytic by mechanical means, as by mild abrasion, e.g., by sand blasting, or by chemical means, as by treatment with chemical solvents, etchants, milling solutions, and the like. A preferred chemical treatment for rendering the surface catalytic and improving bond is to treat the surface with acids or oxidizing agents, e.g., nitric and chromic acids, permanganates and the like. Alternatively, the exposed surface or surfaces of the catalytic bases could be made catalytic by coating them with a thin film of the catalytic adhesives or inks of the type described herein.

In another embodiment, an insulating resinous material having a catalytic agent dispersed therein, or dissolved therein, or reacted or complexed therewith, is used to impregnate laminae of paper, wood, Fiberglas, polyester fibers and other porous materials. These base materials, for example, are immersed in the catalytic resin or the catalytic resin is sprayed onto the base material, after which the base materials are dried in an oven until all the solvent has evaporated. The laminae are then bonded together to form a base of any desired thickness, thereby providing a lamina of the type described impregnated with the catalytic resin.

A further alternative is to pre-form or pre-mold thin films or strips of unpolymerized resin having dissolved in or dispersed in or reacted with or complexed with a catalytic agent, and then laminate a plurality of the strips together to form a catalytic insulating base of the desired thickness. In each embodiment, the interior of the insulating base will be catalytic throughout, such that, when holes or apertures are formed therein at any part, the walls of the holes or apertures will be sensitive to the reception of electroless metal from an electroless metal chemical deposition solution such as an electroless copper solution.

In making catalytic bases of the type described, wherein the catalytic agent is dissolved or dispersed in the resin, it is helpful if the catalytic agent is initially dissolved in a suitable solvent prior to incorporation into the resin. The solvent may then be evaporated during curing of the resin.

In another embodiment, a solution of the catalytic agent could be used to treat an adsorbent filler to thereby impregnate the filler with a catalytic agent. The catalytic filler could then be incorporated into the base or carrier material. Typical fillers are those ordinarily used in resins and plastics. As examples may be mentioned aluminum silicate, silica gel, clay, such as kaolin, attapulgite, and the like. Alternatively, a base exchange resin or clay, including crystalline aluminosilicate, could be base exchanged with an aqueous or organic solution of a catalytic agent in the form of a salt, and the exchanged resin or clay or crystalline aluminosilicate incorporated into the resin base.

Catalytic agents of the type described could also be incorporated into a resin during its manufacture in the form, for example, of a molding powder. The molding powder could then be extruded or otherwise worked to form a plastic article which would be catalytic.

The catalytic insulating base need not be organic. Thus, it could be made of inorganic insulating materials, e.g., inorganic clays and minerals such as ceramic, ferrite, Carborundum, glass, glass bonded mica, steatite and the like. Here, the catalytic agent would be added to inorganic clays or minerals prior to firing.

As already brought out, the term "catalytic" as used herein refers to an agent or material which is catalytic to the reduction of the metal cations dissolved in electroless metal deposition solutions of the type to be described.

Among the organic materials which may be used to form the preferred catalytic insulating bases and adhesives described herein may be mentioned thermosetting resins, thermoplastic resins and mixtures of the foregoing.

Among the thermoplastic resins may be mentioned the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrile styrene co-polymers and acrylonitrile-butadienestyrene co-polymers; polycarbonates; polychlorotrifluoroethylene; and vinyl polymers and co-polymers, such vinyl acetate, vinyl alcohol, vinyl butyral, vinyl chloride, vinyl chloride-acetate co-polymer, vinylidene chloride and vinyl formal.

Among the thermosetting resins may be mentioned allyl phthalate; furane; melamine-formaldehyde; phenol formaldehyde and phenol-furfural co-polymer, alone or compounded with butadiene acrylonitrile co-polymer or acrylonitrile-butadienestyrene co-polymers; polyacrylic esters; silicones; urea formaldehydes; epoxy resins, allyl resins; glyceryl phthalates; polyesters; and the like.

The catalytic adhesives will ordinarily comprise a flexible adhesive resin, alone or in combination with thermosetting resins of the type described. Typical of the flexible adhesive resins which may be used in such a system are the flexible adhesive epoxy resins, polyvinyl acetal resins, polyvinyl alcohol, polyvinyl acetate, and the like. Preferred for use as the adhesive resin are natural and synthetic rubber, such as chlorinated rubber, butadiene acrylonitirle co-polymers, and acrylic polymers and co-polymers.

The adhesive resins of the type described have appended thereto polar groups, such as nitrile, epoxide, acetal and hyroxyl groups. Such adhesive resins co-polymerize with and plasticize any thermosetting resins which may be present in the system, and alone or in combination with the thermosetting resins impart good adhesive characteristics through the action of the polar groups.

Typical examples of the catalytic bases and adhesives for use herein are given below:

Example 1

| | | |
|---|---|---|
| Butyrolactone | grams | 60 |
| Palladium chloride | do | 0.1 |
| Concentrated (37%) hydrochloric acid | drops | 5 |

The composition of this example is added to an epoxy resin-hardener system, and the system permitted to cure to form a resin base whose interior is catalytic to the reception of electroless metal.

Example 2

| | | |
|---|---|---|
| N-methyl-2-pyrrolidone | grams | 50 |
| Palladium chloride | do | 0.5 |
| Diacetone alcohol | milliliters | 450 |

Prolonged agitation is required to assure complete solution of the palladium chloride. The resulting solution may be added to a variety of thermoplastic and thermosetting resinous base materials and also used to impregnate glass cloth. Following evaporation of the solvent, lamination and/or curing, the resulting bases will be found to be catalytic to the reception of electroless metal.

Other preferred embodiments of catalytic solutions which can be added to resins to produce catalytic bases include:

TABLE

Palladium choride in tetrahydrafuran
Palladium chloride in dimethyl sulfoxide
Palladium chloride in dimethyl sulfoxide and methylene chloride
Palladium chloride in dimethyl formamide
Palladium chloride in Cellosolve acetate
Palladium chloride in methylethyl ketone
Palladium chloride in xylene
Palladium chloride in acetic acid
Palladium chloride in tetrahydrofurfuryl alcohol
Palladium chloride in methylene chloride
Gold chloride in ethyl alcohol
Chloroplatinate in ethyl alcohol.

Of the catalyst solutions listed in the table, particularly stable for long periods of time is a solution of 10% palladium chloride in a mixture of dimethyl sulfoxide and methylene chloride.

As will be clear from the foregoing, the catalyst solutions of the type described in Examples 1 and 2, and in the table, in addition to being highly useful for addition to thermosetting or thermoplastic resin containing systems to catalyze the same, are also suitable for impregnating coating materials, such as paper and glass cloth containing resinous laminates and the like, to render such compositions catalytic. These catalytic solutions may also, for example, be used in combination with solid catalytic agents, e.g., metals and metal oxides of Groups 1 and 8, to make systems containing solid, dispersed catalytic agents more responsible to electroless metal deposition.

The catalytic insulating adhesives of this invention are used to bond layers of material together so that the interface is catalytic to electroless metal deposition. In use, the surfaces of the material to be bonded need only be immersed in or sprayed with the catalytic adhesives, following which the solvent may be evaporated as by heating, to deposit on the substrate a flexible adhesive resin containing therein the catalytic agent. Typical systems of this type are described in Examples 3 to 5.

Example 3

A catalytic adhesive was prepared accordng to the following formulation:

| | Grams/liter |
|---|---|
| Ethylene glycol monoethyl ether acetate (Cellosolve acetate) | 600 |
| Epoxy resin (ERL 2256) | 109 |
| Acrylonitrile butadiene co-polymer rubber (Hycar 1312) | 20 |
| Phenolic resin (SP 103) | 20 |
| Phenolic resin (SP 126) | 20 |
| Phenolic resin (SP 6600) | 20 |
| Acrylonitrile-butadiene (Paracil CV) | 144 |
| Silicon dioxide (Cab-O-Sil) | 50 |
| Wetting agent (Igepal 430) | 17.5 |

Separate solutions of the following salts were prepared by dissolving the salts in 50 grams N-methyl-2-pyrrolidone at room temperature:

Palladium chloride
Cupric chloride
Silver nitrate
Auric chloride.

The resulting solutions were mixed with an equal part by weight of the adhesive binder. Each of the resulting adhesive resin systems may be used to bond insulating and/or conducting laminae together so as to provide a bond interface which is catalytic to the recepton of electroless metal.

Example 4

| | Grams |
|---|---|
| N-methyl-2-pyrrolidone | 50 |
| Auric chloride | 1.67 |
| Adhesive 10 | 300 |

Example 5

| | Grams |
|---|---|
| N-methyl-2-pyrrolidone | 50 |
| Palladium chloride | 1 |
| Stannous chloride | 1.13 |
| Adhesive 10 | 300 |

Example 6

| | Grams |
|---|---|
| N-methyl-2-pyrrolidone | 40 |
| Auric chloride | 1.67 |
| Stannous chloride | 1.13 |
| Adhesive 10 | 300 |

In Examples 4, 5 and 6, the ingredient designated as Adhesive 10 corresponds to the following clear adhesive system:

| | Grams |
|---|---|
| Methylethyl ketone | 1200 |
| Acrylonitrile-butadiene (Paracil CV) | 72 |
| Phenolic resin (SP 8014) | 14 |

The catalytic adhesive solutions of Examples 4, 5 and 6 are especially suitable for use in bonding thermoplastics.

The addition of the stannous chloride in Example 4, 5 and 6 appears to render the systems more active and more responsive time-wise to the action of the electroless metal baths.

Typically, the autocatalytic or electroless metal deposition solutions for use with the catalytic insulating bases and adhesives described comprise an aqueous solution of a complex or chelate of the metal or metals to be deposited and a reducing agent for the metal cations. Complexing or sequestering agents may be used to form a water soluble complex with cations of the metal or metals to be deposited so as to maintain the metal or metals in solution. The function of the reducing agent is to reduce the metal cation to metal at the appropriate time, as will be made more clear hereinbelow.

Typical of such solutions are electroless copper, electroless nickel and electroless gold solutions. Such solutions are well known in the art and are capable of autocatalytically depositing the identified metals without the use of electricity.

Electroless copper solutions which may be used are described in U.S. Pat. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediaminetetraacetic acid, and a pH-adjustor, e.g., sodium hydroxide.

Electroless nickel baths which may be used are described in Brenner, "Metal Finishing," November 1954, pages 68 to 76, incorporated herein by reference. They comprise aqueous solutions of a nickel salt, such as nickel chloride; an active chemical reducing agent for the nickel salt, such as the hypophosphite ion; and a complexing agent, such as carboxylic acids and salts thereof.

Electroless gold plating baths which may be used are disclosed in U.S. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid and salts thereof, such as the sodium, calcium and the ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 14, and the ion ratio of hypophosphite radical to insoluble gold salt may be between about 0.33 and 10 to 1.

Specific examples of electroless copper depositing baths suitable for use will now be described:

Example 7

| | Moles/liter |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55° C. and will deposit a coating of ductile electroless copper about 1 mil. thick in about 51 hours.

Other examples of suitable baths are as follows:

Example 8

| | Moles/liter |
|---|---|
| Copper sulfate | 0.02 |
| Sodium hydroxide | 0.05 |
| Sodium cyanide | 0.0002 |
| Trisodium N - hydroxyethylethylenediaminetriacetate | 0.032 |
| Formaldehyde | 0.08 |
| Water | Remainder |

This bath is preferably operated at a temperature of about 56° C., and will deposit a coating of ductile electroless copper about 1 mil. thick in 21 hours.

Example 9

| | Moles/liter |
|---|---|
| Cpoper sulfate | 0.05 |
| Diethylenetriamine pentaacetate | 0.05 |
| Sodium borohydride | 0.009 |
| Sodium cyanide | 0.008 |

pH, 13.
Temperature, 25° C.

Example 10

| | Moles/liter |
|---|---|
| Copper sulfate | 0.05 |
| N-hydroxyethylethylenediaminetriacetate | 0.115 |
| Sodium cyanide | 0.0016 |
| Sodium borohydride | 0.008 |

pH, 13.
Temperature, 25° C.

Utilizing the electroless metal baths of the type described, very thin conducting metal films may be laid down. Ordinarily the metal films superimposed by electroless metal deposition will range from 0.1 to 7 mils. in thickness, with metal films having at hickness of even less than 0.1 mil. being a distinct possibility.

The invention consists in the novel parts, constructions, arrangements, combinations and improvements herein shown and described. The accompanying drawings referred to herein and constituting a part thereof, illustrate certain embodiments of the invention and together with the specificaion serve to explain the principles of the invention.

Figure 1:
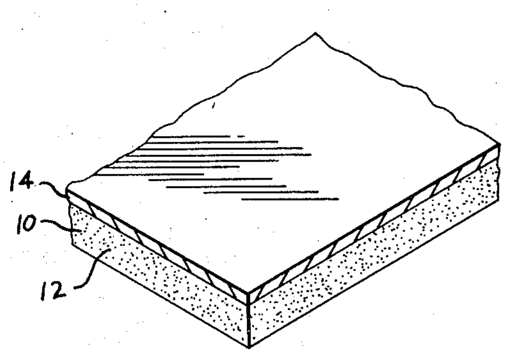
FIGS. 1 and 2 are three-dimensional views of certain embodiments of blanks useful in the production of printed circuits in accordance with this invention.

FIGS. 5A, 6B, 6C, 7A, 8B, 9B, 10B, 11B and 12B are cross-sectional views of alternate embodiments of printed circuits produced in accordance with this invention from the blanks of FIGS. 3–9; and FIGS. 13–32 illustrate procedures which can be used to produce printed circuit boards from the blanks described herein, and/or alternative embodiments of printed circuit boards produced in accordance with the teachings herein.

In the drawings, similar reference numerals are used to represent similar parts.

In FIG. 1 is shown a blank with comprises, in its simplest form, an insulating base 10 having distributed therein an agent 12 which is catalytic to the reception of electroless metal from an electroless metal deposition solution. Hereinafter whenever the term "catalytic" is employed, it will refer to a material which has this property, i.e., the ability to receive a metal deposit when exposed to an electroless metal deposition solution, or to catalyze the deposition of metal from such a solution. The catalytic agent 12 may be dissolved in or dispersed throughout the base 10. Alternatively, the insulating base material itself may be catalytic to the reception of electroless metal, e.g., the insulating base material may be formed in whole or in part of an insulating organo-metallic compound which is catalytic to the reception of electroless metal. Superimposed on the base 10 and adhered thereto is a thin unitary and integral metal film or laminate 14 which preferably covers and is substantially conterminous with, i.e., has the same boundaries as, the surface of base 10. The thickness of the metal film 14 will depend primarily upon the manner in which it is fabricated and bonded to the base 10, and will also depend upon the ultimate use to which the blank is to be put. Typically, the metal film will have a thickness of between about 0.05 micron and 175 microns. In a preferred embodiment, the metal film 14 is copper. The thickness of the metal film 14 when made of copper will preferably be such that its weight will vary between about 0.03 and 2 ounces per square foot.

When the metal film 14 is superimposed on the base 10 by means of conventional metal cladding techniques, i.e., by preforming a thin foil of metal, e.g., by electrolytic deposition, and laminating it to the base, the foil 14 will usually have a thickness greater than 17 microns. On the other hand, if the metal film is produced by vapor deposition or by the electroless chemical metal deposition technique described herein, it can be as thin as 0.05 micron.

In accordance with a preferred embodiment of the blank, the film 14 is produced by electroless metal deposition, preferably electroless copper deposition, and has a thickness of between about 0.05 and 30 microns, preferably between about 0.1 and 10 microns. Thin films of the type disclosed having a thickness of less than 5 microns and preferably between 2 and 4 microns, have the ability to be quick etched, as described hereinbelow.

Figure 2:
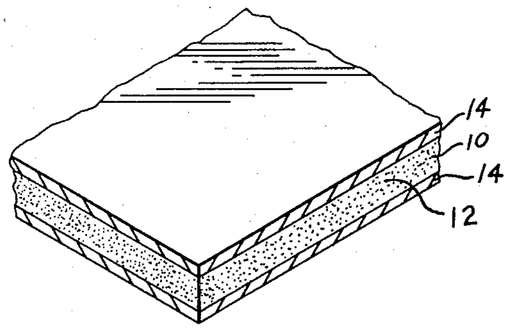

In FIG. 2, there is shown an embodiment of the blank which comprises an insulating member 10 containing a catalytic agent 12. Adhered to both surfaces of the base are thin unitary metal films 14.

Figure 3:
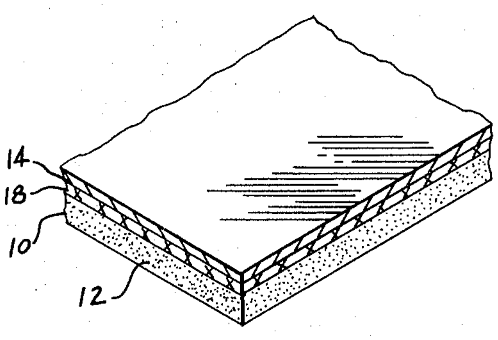
FIGS. 3 and 4 are cross-sectional views of further embodiments of catalytic blanks useful in the production of printed circuits in accordance with this invention.
Figure 4:
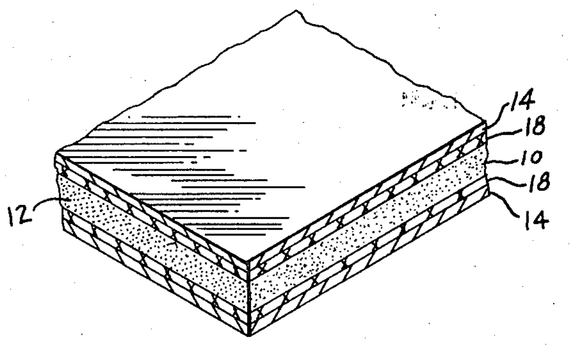

FIGS. 3 and 4 illustrate modified embodiments of the blank shown in FIGS. 1 and 2. Thus, in FIG. 3, the catalytic base 10 has superimposed thereon an insulating adhesive resin 18 which is itself catalytic to the reception of electroless metal. The adhesive resin 18 has dissolved therein or dispersed therein a catalytic agent. Alternatively, the adhesive resin 18 may be formed in whole or in part of an insulating organo-metallic compound which is itself catalytic to the reception of electroless metal. The thin layer of metal 14 is adhered to the base 10 by the catalytic adhesive 18.

Similarly, in FIG. 4, the catalytic base 10 is coated on both surfaces with an adhesive 18, which is catalytic, and thin metal films 14 are adhered to both surfaces of base 10 by the adhesive 18.

When certain forms of catalytic agent, e.g., solid particles, are used to prepare the catalytic base 10, there is a tendency for the surface layers of the base 10 to be rich in resin and low in catalyst. As a result, depending upon how the base 10 is manufactured, it sometimes happens that the surface of the base is non-catalytic, even though the interior of base 10 is highly catalytic. This situation is remedied by coating one or both surfaces of the base 10 with a catalytic adhesive 18, as shown in FIGS. 3 and 4. Alternatively, such surfaces could be rendered catalytically active by treatment with acids. Especially suitable are oxidizing acids such as sulfuric, nitric, chromic and toluene sulfonic acids, including mixtures of the foregoing. Treatment with such acids not only renders the surface catalytically active, but it also frequently serves to considerably enhance the bond between the surface and electroless metal deposited thereon.

Figures 13, 14, 15:
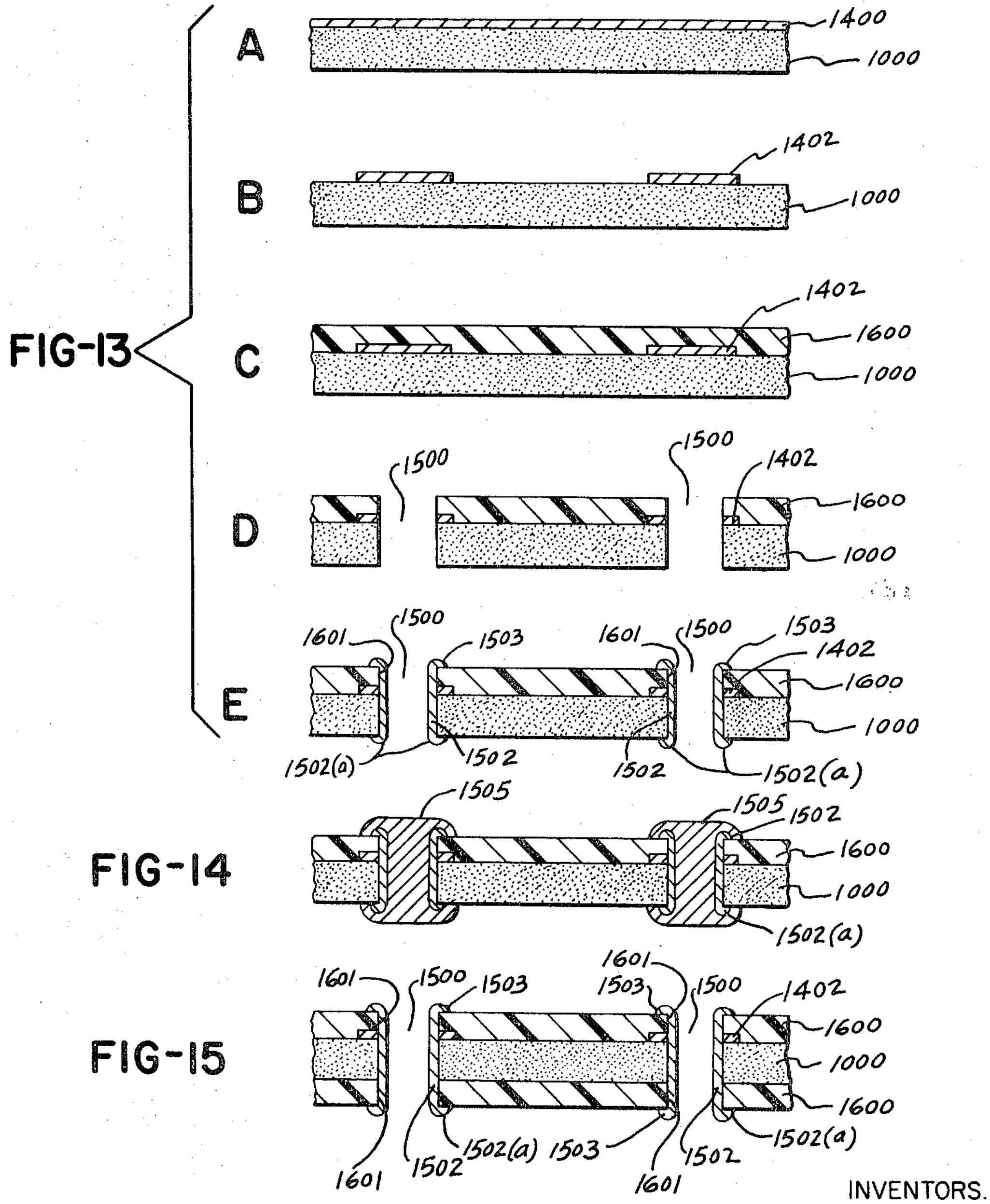

FIG. 13 illustrates the steps to be used in the manufacture of a one-sided plated through hole board in accordance with this invention from the blank shown in FIG. 1. In FIG. 13A is shown a blank which comprises a catalytic base 1000 having bonded thereto a thin film of metal 1400. At B in FIG. 13, a circuit pattern 1402 has been produced on base 1000 by following standard print and etch principles well known in the art. In FIG. 13C, the circuit pattern 1402 has been covered completely with a non-registered solder mask 1600. In FIG. 13D holes 1500 are then provided in the board. In FIG. 13E, the board has been subjected to an electroless metal solution to deposit a coating of electroless metal 1502 on the walls surrounding the holes 1500. In FIG. 13E, the metal in the holes 1502 coats the walls of the holes and creeps over the edges 1601 of the non-registered mask 1600 to form exposed lands or pads 1503 which surround the holes 1500. These lands or pads 1503 are spaced from and are non-planar with conductor lines 1402. Note that deposit 1502 also creeps over the edge of the wall at the bottom surface to form exposed lands or pads 1502(*a*) which surround the holes at the bottom surface of the boards. When subjected to a solder bath, the board of FIG. 13E will receive solder on the wall plating 1502, as well as on the pads or lands 1502(*a*) and 1503, as shown at 1505 in FIG. 14.

If desired, a permanent resin mask 1600 could be superimposed on both surfaces of the board to enhance the insulating characteristics of the board. Such a one-sided circuit board would have the appearance (before soldering) shown in FIG. 15. Here again, plating of the walls will be continued until the wall deposit creeps over the insulating masks to produce lands or pads 1502(*a*) and 1503 on the horizontal edges of the masks surrounding the holes.

The lands or pads 1502(*a*) and 1503 are essential to insure good solderability of the boards. Thus, absent such lands or pads, it is difficult to wave solder the plated walls. The reason for this phenomenon will be clear from an inspection of FIGS. 16–19.

It should first be stated that in the manufacture of the boards described herein, the deposit on the walls of the holes will grow simultaneously in a vertical as well as a lateral direction and will therefore tend to creep up on and coat the walls of the insulating mask surrounding the hole, even though the mask is not itself catalytic to the reception of electroless metal.

FIGS. 16–19 illustrate magnified cross-sections of plated through hole configurations at the ingress or egress of holes 1500 during the manufacture of printed circuit boards in accordance with this invention.

Figure 16:
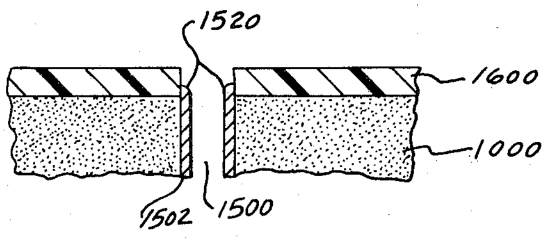
Figure 17:
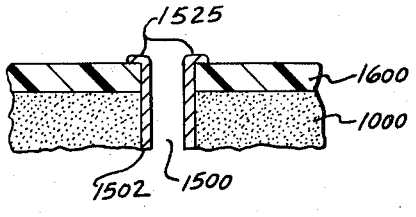
Figure 18:
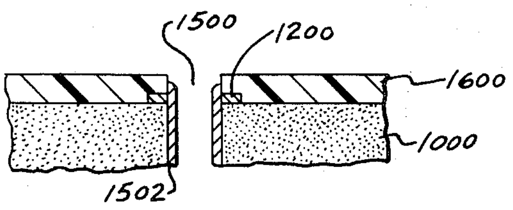
Figure 19:
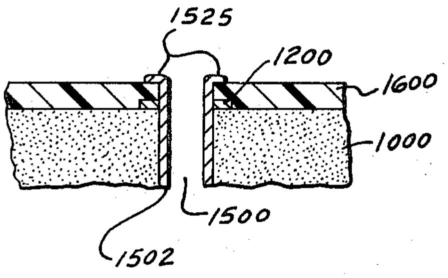

As shown in FIGS. 17 and 19, by decreasing the thickness of the insulating mask or by increasing the thickness of the deposit of metal on the hole walls as by increasing the rate or time of electroless deposition, the deposit on the wall 1502 can be made to creep up on the surface of the mask 1600 surrounding the wall and over the surface of the mask so as to form, spontaneously, an eyelet, pad or land 1525 on the surface of the mask. When the mask 1600 is sufficiently thick, however, or the hole plating sufficiently thin, the plating will stop short of the mask surface to form landless holes as shown in FIGS. 16 and 18.

In FIGS. 18 and 19, 1200 represents a portion of a printed circuit pattern, i.e., a conductor line, which is in electrical contact with the plating 1502 on the wall of hole 1500. In FIGS. 16–19, 1000 represents a catalytic base.

Of course, ingress or egress hole structures varying anywhere between the extremes shown in FIGS. 16 and 18, on the one hand, and FIGS. 17 and 19, on the other hand, may be achieved by varying the relative thickness of the wall plating and non-printed masks, cleaning cycles and surface tension of the plating solutions. For example, the presence of wetting agents in the electroless metal solutions reduces the tendency of the deposit to creep up the wall of the insulating mask surrounding the hole.

For solderability, it is essential that the parameters be correlated such that the plating on the hole wall extends up to or approximately up to the exterior surface of the solder mask. Otherwise, when the board is exposed to molten solder, the solder will not penetrate the hole, and, as a result, the plating on the hole wall will not accept a solder coat, or will be non-uniformly or imperfectly solder-coated. Although the reason for the lack of solderability of boards of the type described in FIGS. 16 and 18 is not clearly understood, it is believed that it can be attributed to the fact that the mask in such boards acts as a heat barrier which insulates the plating on the hole from the hot solder. As a result, the wall plating, upon exposure of the board to molten solder, remains comparatively cool, compared with the hot solder. This difference in temperature sets up forces, e.g., convection currents, which retard entry of the hot solder into the hole. More important, probably, is the fact that the comparatively "cool," non-heat conducting edge of the mask surrounding the hole cools the solder in contact therewith, thereby inhibiting the flow characteristics of the solder. When, however, the hole plating extends up to or closely adjacent the exterior surface of the solder mask, the portion of the hole plating adjacent the surface is heated by the molten solder bath, and in turn conducts heat from the solder bath to the interior portion of the plating, thereby causing the plating to be heated. The heated plating, in turn, causes the hot solder in contact therewith to remain hot and to retain its flow characteristics, and to thereby flow into the holes and coat the wall plating substantially uniformly over the cross-section of the board, thereby insuring reliable solder joints. For best results, as already emphasized, the hole wall plating should creep over the edge of the solder mask, so as to form a small pad or eyelet surrounding the hole, but spaced from the plane of the conductor lines making up the printed circuit pattern.

Figure 17A:
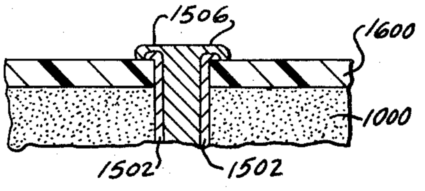
Figure 19A:
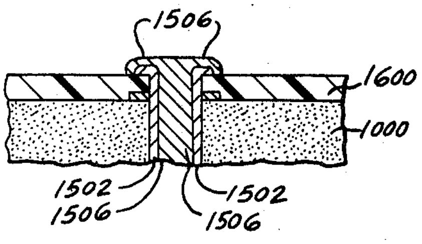

When such boards, e.g., those shown in FIGS. 17 and 19, are exposed to molten solder, a solder coat 1506 forms uniformly over the wall plating 1502, as shown in FIGS. 17A and 19A. Note that the solder mask 1600 protects the conductor lines 1200 during soldering and any subsequent re-work operation.

By utilizing the non-registered mask technique of FIG. 13 problems heretofore encountered in the manufacture of high density printed circuit boards are surprisingly eliminated. When the circuit board of FIG. 13E is subjected to a solder bath, solder deposits only on the electroless metal deposit 1502 on the walls surrounding hole 22 and on the exposed pads 1503, as shown in FIG. 14. The mask 1600 insures that no solder deposits on the surface of the circuit board itself. Also note that the lands 1503 are in a different plane from that of the conductor lines 1402. The arrangement substantially eliminates any possibility of solder bridging.

It should again be emphasized that the permanent non-registered insulating mask concept described herein, although suitable for the manufacture of a wide variety of printed circuit boards, has exceptional advantages when used in combination with the catalytic bases described to produce high density plated through hole printed circuit boards. Such a technique using the identified materials represents substantially the only practical way for achieving even plating on the walls of small, high aspect ratio (small diameter with respect to the thickness of the part) holes. Heretofore, using conventional techniques and materials, the plating on the hole walls has tended to be quite uneven.

The non-registered permanent solder mask concept avoids the problems heretofore described of printing a permanent insulating mask. As has been brought out above, it is very difficult using modern printing concepts to print a registered permanent solder mask on boards on which the hole centers are spaced a distance less than 125 mils. The consensus in the art is that when the holes are less than 100 mils apart, it is practically impossible to print a registered permanent solder mask.

It should also be brought out that the catalytic insulating bases used as blanks in the manufacture of printed circuit boards described herein enhances the reliability of the circuit boards to a substantial extent. With such boards, the hole walls are ordinarily receptive to the reception of electroless metal regardless of where the holes are placed. Further, since the catalytic agent is an integral part of and evenly dispersed throughout the insulating base, the chances of achieving dead spots on the hole walls is infinitesimal. In prior seeding and sensitizing techniques, there is a good probability of the "seed" dropping off the hole walls, thereby causing dead spots which are not plated when the wall is exposed to an electroless metal deposition solution. The techniques described herein also have obvious cost and yield advantages over many of the prior art techniques for manufacturing plated through hole boards of the type described.

The printed pattern may be formed on the metal clad blanks of this invention in a variety of ways.

In the so-called photographic technique, the surface is cleaned and degreased, and a light sensitive enamel is uniformly spread over the metal foil and dried.

The photographic system of printing could also be used to produce the mask in an additive process for producing a circuit pattern by electroless metal deposition techniques described herein. Whenever required, the light sensitive enamel could be made catalytic to the reception of electroless metal by dissolving or dispersing therein an agent which is catalytic to the reception of electroless metal.

For long production runs, the photographic system of printing tends to be slow and unduly expensive, except for high precision parts. As a result, etch resist printing will ordinarily be carried out either by offset printing on an offset printing press or by screen stencil printing on a manual or automatically operative screen printing press. The step and repeat negative is used to produce, in the case of an offset printing press, an offset printing plate. Acid resist ink is transferred by a rubber covered roll from the printing plate to the metal clad base.

In screen printing, the step and repeat negative is used to produce a stencil on the silk or wire mesh of the screen frame. The stencil is made photographically from the negative and reproduces it exactly.

Regardless of the type of printing employed, it will be understood that either a positive or a negative image of the desired conducting patterns may be imposed on the base, with suitable modifications to insure that the final conductive pattern desired is ultimately obtained.

When offset or screen stencil printing is employed, the ink used in printing is acid resistant, so that the portions of the metal foil covered thereby are not affected by the etching solution when the plate is contacted therewith. Such acid resistant inks are well understood in the art, and commonly comprise resins such as cellulose acetate, cellulose butyrate, casein-formaldehyde, styrene-maleic anhydride, and the like. Such materials are acid resistant but can be readily removed when desired by readily available solvents or otherwise.

Etching solutions commonly used with copper clad stock include ammonium persulfate or ferric chloride. The etching operation may be carried out by either blasting the surface of the panel with a fine spray of the etchant solution or immersing the printed sheets, which are held in a rack or on a conveyor, in an agitated tank of the etchant. The etching operation is controlled by temperature, the concentration of the etching solution and time of contact, and these variables must be carefully controlled empirically for good results. After etching, a water rinsing process is employed to remove all etching chemicals, thereby preventing contamination of the surface or edges of the panel.

Additional catalytic blanks for use in making the printed circuit boards of this invention are shown in FIGS. 5–11.

Figure 5:
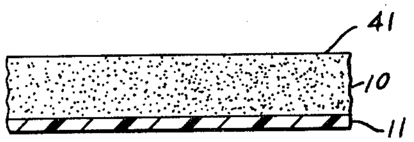
FIGS. 5–12 are cross-sectional views of additional catalytic blanks which may be used to produce circuit boards in accordance with this invention.
Figure 6:
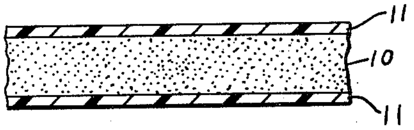

Thus, in FIG. 5 there is shown a blank which consists of a catalytic insulating base 10 which has a non-catalytic insulating surface 11 either bonded thereto or integral therewith. The non-catalytic insulating surface 11 will ordinarily be conterminous with the adjacent surface of the base 10. In FIG. 6 is shown a blank which comprises a catalytic insulating base 10 having non-catalytic insulating surfaces 11 either bonded to or integral with both surfaces of the base 10. Here again, non-catalytic insulating surfaces 11 will ordinarily be conterminous with the adjacent surfaces of base 10.

Figure 7:
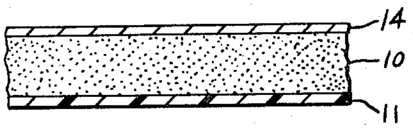

In FIG. 7 is shown a blank comprising a catalytic insulating base 10 comprising a conterminous lower non-catalytic insulating surface 11. Adhered to the upper surface and preferably conterminous therewith is a thin film of metal 14.

Figure 8:
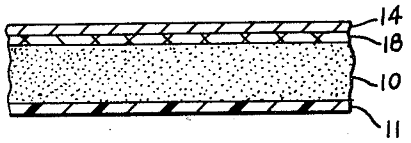

In FIG. 8 is shown a blank useful for the manufacture of printed circuit components which comprises a catalytic insulating base 10 having one non-catalytic insulating surface 11 conterminous therewith. The opposite surface of the catalytic base member 10 comprises a catalytic insulating adhesive layer 18 on which is superimposed a thin metal film 14.

Figure 9:
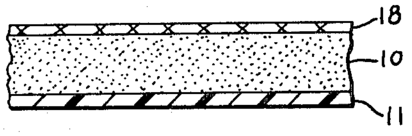

In FIG. 9 is shown still another embodiment of a blank which comprises a catalytic insulating base 10 having one insulating surface 11 which is non-catalytic and a second insulating surface 18 which comprises an insulating catalytic adhesive of the type described herein.

Figure 10:
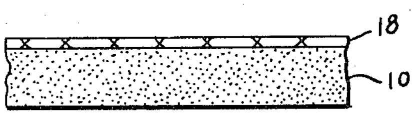
Figure 11:
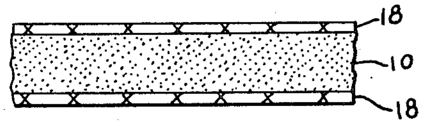

Additional blanks which are suitable for use in the preparation of printed circuits or generally in the metallization of plastic substrates are shown in FIGS. 10 and 11. In FIG. 10 there is shown a blank which comprises an insulating catalytic base 10 having one surface which comprises a catalytic insulating adhesive 18.

In FIG. 11, there is shown another blank which comprises a catalytic insulating base 10, both surfaces of which comprise a catalytic insulating adhesive 18.

Figure 12:
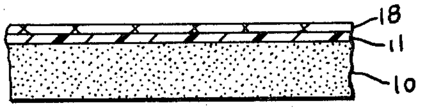

In FIG. 12 is shown a blank comprising a catalytic insulating base 10, having a non-catalytic surface 11 to which is adhered a catalytic insulating adhesive 18.

Preferably, in those embodiments of the invention calling for a catalytic adhesive 18, the adhesive will take the form of a flexible adhesive resin of the type described hereinbelow. The flexible adhesive resins which are catalytic to the reception of electroless metal and are also insulating in nature, insure a strong reliable bond between the circuit pattern and the catalytic insulating base.

As will be appreciated from the foregoing, all of the blanks described herein may be metallized directly without the necessity of seeding prior to metallization.

A distinct advantage of these blanks in printed circuit manufacture is that they can be used to produce directly rugged and reliable printed circuit boards having plated through holes. Use of such blanks eliminates the pre-seeding and/or presensitizing steps of conventional practice together with the concomitant problems associated with such practice.

Catalytic insulating bases containing non-catalytic surfaces may be made in a variety of ways. Thus, the catalytic insulating base could be made with a minimal amount of catalytic agent to insure that the surface of the base is extremely high in insulating and extremely poor in catalyst. When formed, such as base, or laminates impregnated with such a base, will have surfaces which are substantially non-catalytic to the deposition of electroless metal.

Alternatively, a catalytic insulating base rich in catalyst could be prepared and one or both surfaces thereon then coated with a non-catalytic insulating film or adhesive. For example, when the catalytic base is made by impregnating paper or fibrous substrata, e.g., fiberglass with catalytic resin, a final gel coat of non-catalytic resin could be superimposed on the laminated structure during manufacture to produce the non-catalytic surface. Alternatively, a film of non-catalytic resin could be bonded to the substrata following completion of lamination.

As already described, in the manufacture of the catalytic base materials and adhesives, an agent which is catalytic to the reception of electroless metal is distributed throughout an insulating base or adhesive, as by dissolution, dispersion, or by reacting a part or all of the material of the base or adhesive with a catalytic agent so as to form a chemical compound or complex, which is itself catalytic to the reception of electroless metal. The result-base or adhesive will be catalytic to the reception of electroless metal throughout its interior.

Exposed surfaces of the catalytic base materials of this invention are catalytic to the reception of electroless metal, or may be rendered catalytic by subjecting the surface to relatively mild mechanical or chemical abrasion or etching or by coating the surface with catalytic adhesives of the type described.

A film of metal as shown in FIGS. 1–4, accordingly, may be readily superimposed on such a base simply by immersing the base in an electroless metal deposition solution of the type to be described. Alternatively, the catalytic base could actually be clad with a thin metal foil, using typical metal cladding or lamination techniques, e.g., by bonding a thin foil of metal to the base.

Figure 5A:
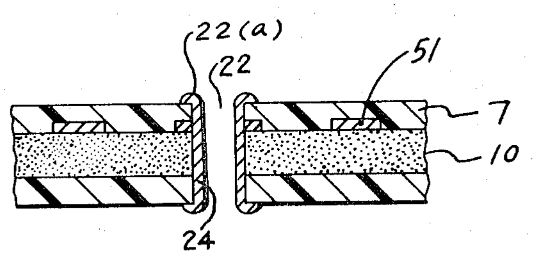

A printed circuit board as depicted in FIG. 5A may be readily made from the blank of FIG. 5. Thus, a negative mask of the circuit could be superimposed on the upper surface 41 of the catalytic base 10 shown in FIG. 5. The entire blank would then be exposed to an electroless metal deposition solution to deposit electroless metal on the area of surface 41 not covered by the mask, following which the mask would be removed. Next, a non-printed solder mask 51 would be superimposed over the surface of the boards, and holes 22 punched or drilled. Upon exposure to the electroless metal solution, electroless metal will deposit on the walls of the holes. The finished circuit board is depicted in FIG. 5A, wherein 51 represents the printed circuit pattern which includes holes 22 with plated walls 24, including exposed pads 22(*a*). The board has an insulating, non-catalytic base 11 and a solder mask 7.

Figure 6B:
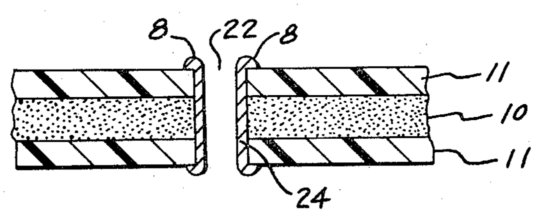
Figure 6C:
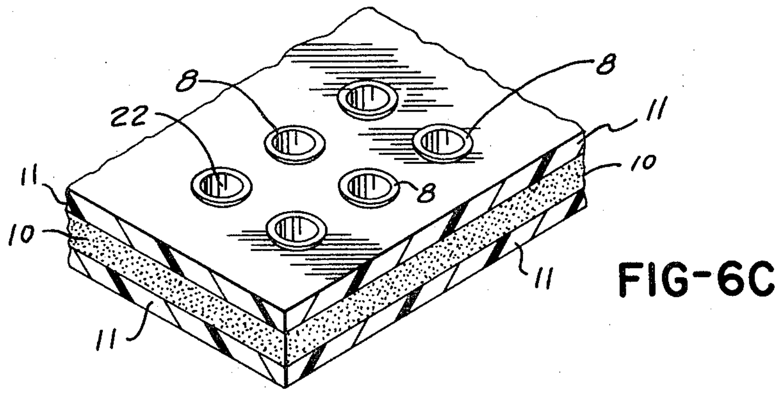

The blank of FIG. 6 could be used to make plated through hole boards of the type shown in FIG. 6B. The top and bottom surfaces 11 of the circuit of FIG. 6B are non-catalytic, as brought out hereinabove. The circuit of FIG. 6B is made by providing holes 22 in the blank of FIG. 6 and then subjecting the blank to an electroless metal deposition solution to plate the walls 24 of holes 22. The blank of FIG. 6 could be provided with a network of holes arranged in a random pattern or in predetermined relationship or in a grid-pattern, as shown in FIG. 6C. When exposed to electroless metal solution, the walls of the holes 22 forming the grid in FIG. 6C would be plated as shown at 24 in FIG. 6. Plating is continued for a long enough period of time to permit formation of pads 8 which extend over the surfaces of the masks 11. The FIG. 6C embodiment could then be used to produce in a simple manner a plated through hole breadboard base for mounting electrical components and a wide variety of other uses in various industries, e.g., the electronics industry. The holes in the embodiment of FIG. 6C could have the same or different diameters and be regularly or irregularly spaced.

Figure 9B:
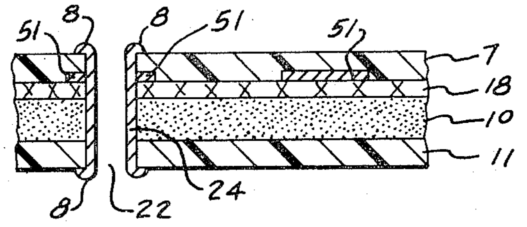

The printed circuit board shown in FIG. 9B may be readily made from the blank of FIG. 9 using the additive process described above in connection with FIG. 5A. The circuit board of FIG. 9B comprises a catalytic base 10 coated with a catalytic resin 18 on which is superimposed a circuit pattern 51. The board has holes 22 with plated walls 24 which end in exposed pads 8. The lower surface of the base 10 comprises a non-catalytic surface 11, and the upper surface is coated with a non-printed solder mask 7.

Figure 7A:
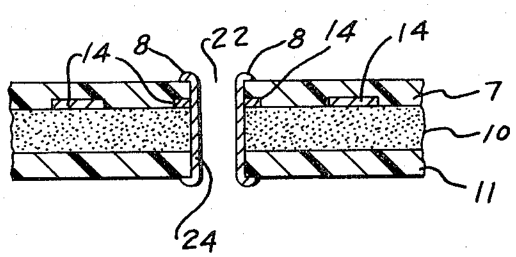
Figure 8B:
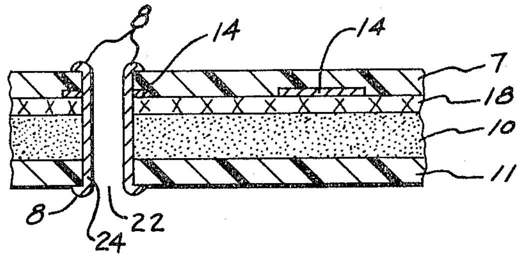
Figure 10B:
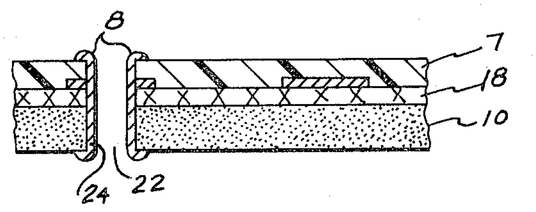
Figure 11B:
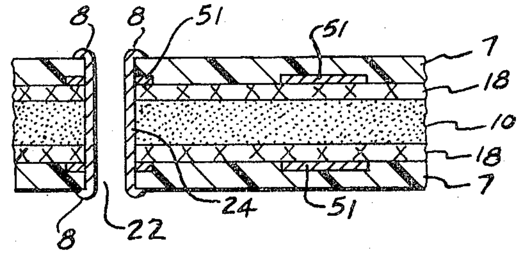
Figure 12B:
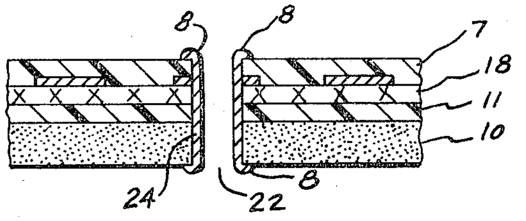

FIG. 10B represents a circuit board formed by the additive electroless metal deposition porcess heretofore described from the blank of FIG. 10. Similarly, FIG. 11B represents a two-sided plated through hole board produced by the additive electroless metal deposition process heretofore described from the blank of FIG. 11. Similarly, FIG. 7A, 8B and 12B represent circuit boards produced by the techniques described herein from the blanks of FIGS. 7, 8 and 12, respectively. In FIGS. 5–12, 5A, 6B, 6C, 7A, 8B, 9B, 10B, 11B and 12B, as in all of the drawings, similar reference numerals represent similar parts.

Figure 20:
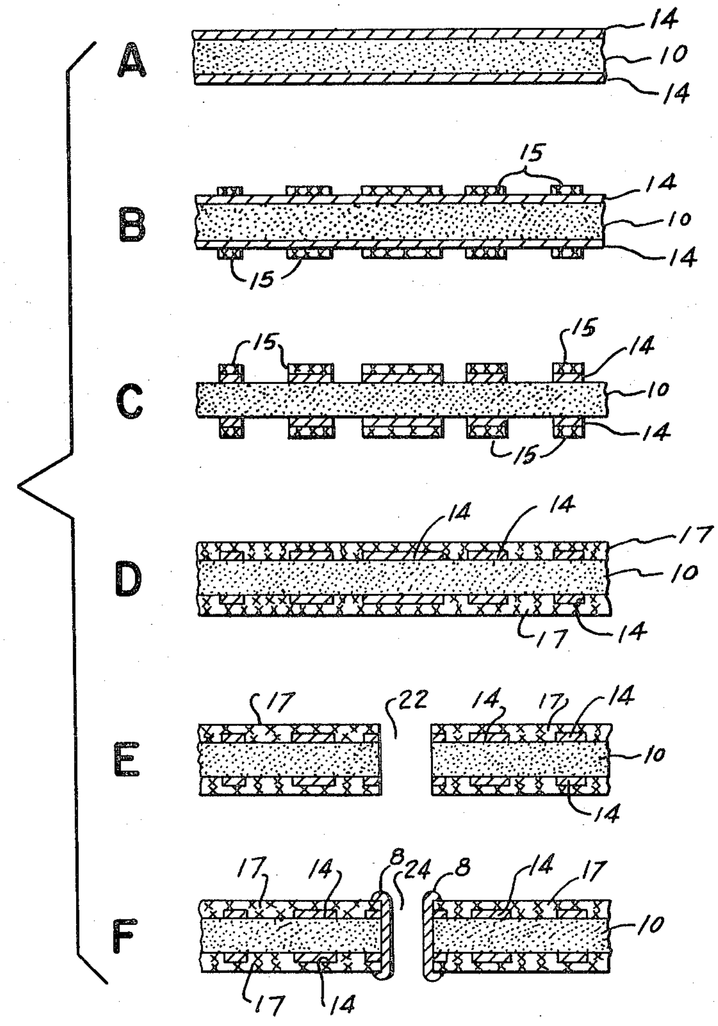

The steps in a process for making the novel two-sided plated through hole printed circuit board using the techniques described herein is described schematically in FIG. 20.

In FIG. 20A is shown a blank comprising a catalytic base 10 clad on both surfaces with metal foil 14. In FIG. 20B, a positive pattern of the desired circuit is made on the surface of the blank by printing a positive pattern of the desired circuit on each surface with an etch resistant ink 15. In FIG. 20C, the metal on both surfaces in the area not covered by the mask has been etched to remove the metal foil. In FIG. 20D, the etch resist 15 has been removed and the panel has been coated on both surfaces with an insulating solder mask 17. Holes or apertures 22 are then made in the panel as shown in FIG. 20E. Any suitable procedure such as punching, drilling, etching and the like, may be used to make the holes 22. The panel is then subjected to electroless deposition for a suitable period of time to form an adherent deposit of electroless metal 24 on the lateral walls of holes 22 to thereby connect the circuit patterns on both sides of catalytic base 10, the finished circuit appearing as shown in FIG. 20F. To insure good solder joints, the plating 24 extends over the edge of mask 17 surrounding the holes to form pads or lands 8.

If desired, the solder mask 17 may be removed after soldering.

Figure 21:
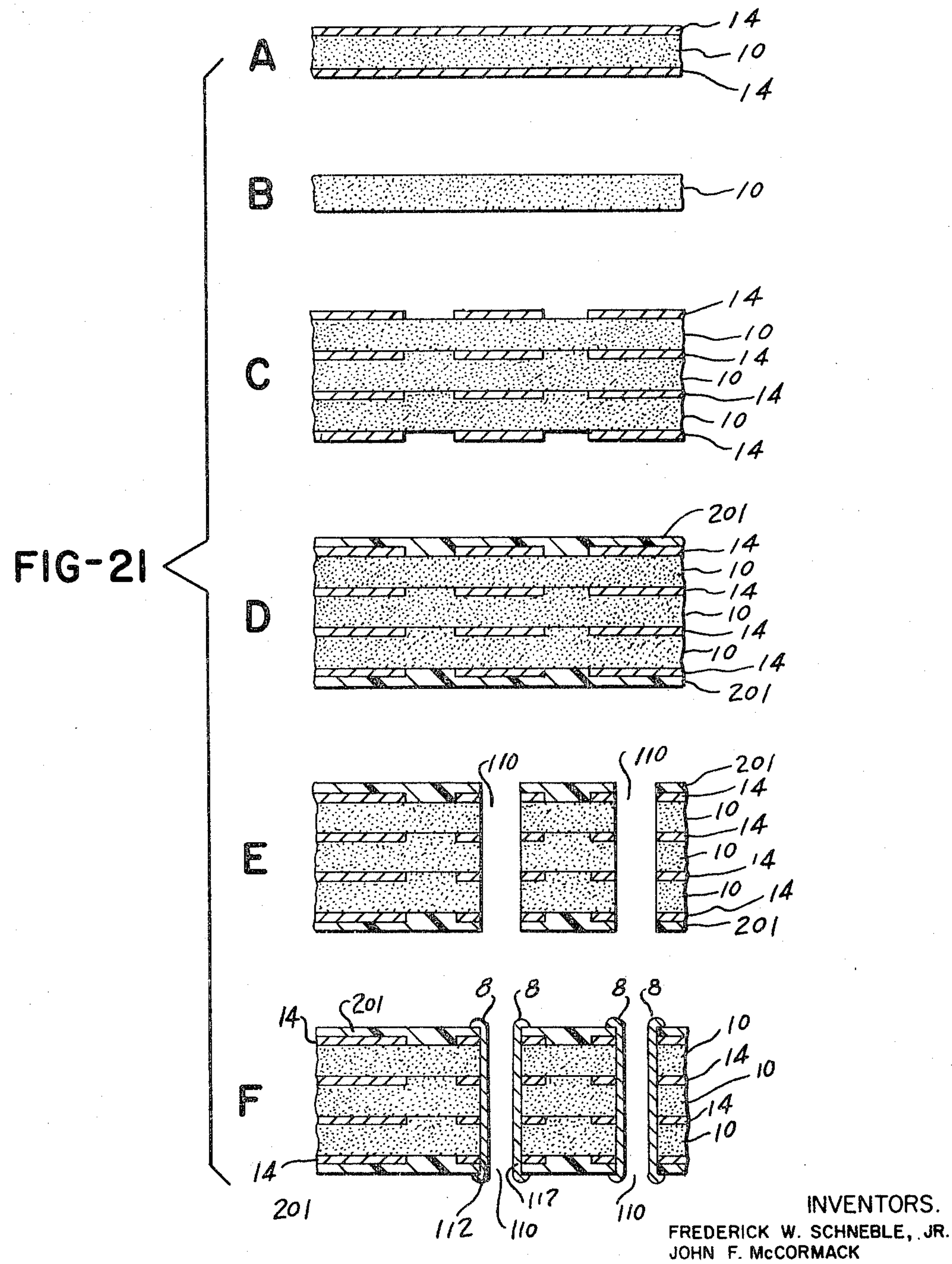

FIG. 21 illustrates the steps to be followed utilizing the FIG. 20 procedure to make a four-layered board from the blanks shown in FIG. 21A and FIG. 21B. In FIG. 21, reference numeral 10 is a catalytic insulating base, 14 is a thin film of metal ahered to said base, 201 is an insulating non-catalytic resinous mask, 110 is a hole, 112 is a deposit of electroless metal coating the walls of holes 110, and 8 is land or pad surrounding the hole to insure good solderability.

It will be appreciated that in the FIGS. 20 and 21 embodiments, the original circuit pattern 14 shown could, if desired, be produced by the additive technique, described hereinabove, rather than the print and etch technique.

One embodiment for producing multi-layer plated through hole boards utilizing the non-registered permanent resin mask concept has already been illustrated in FIG. 21.

Figure 22:
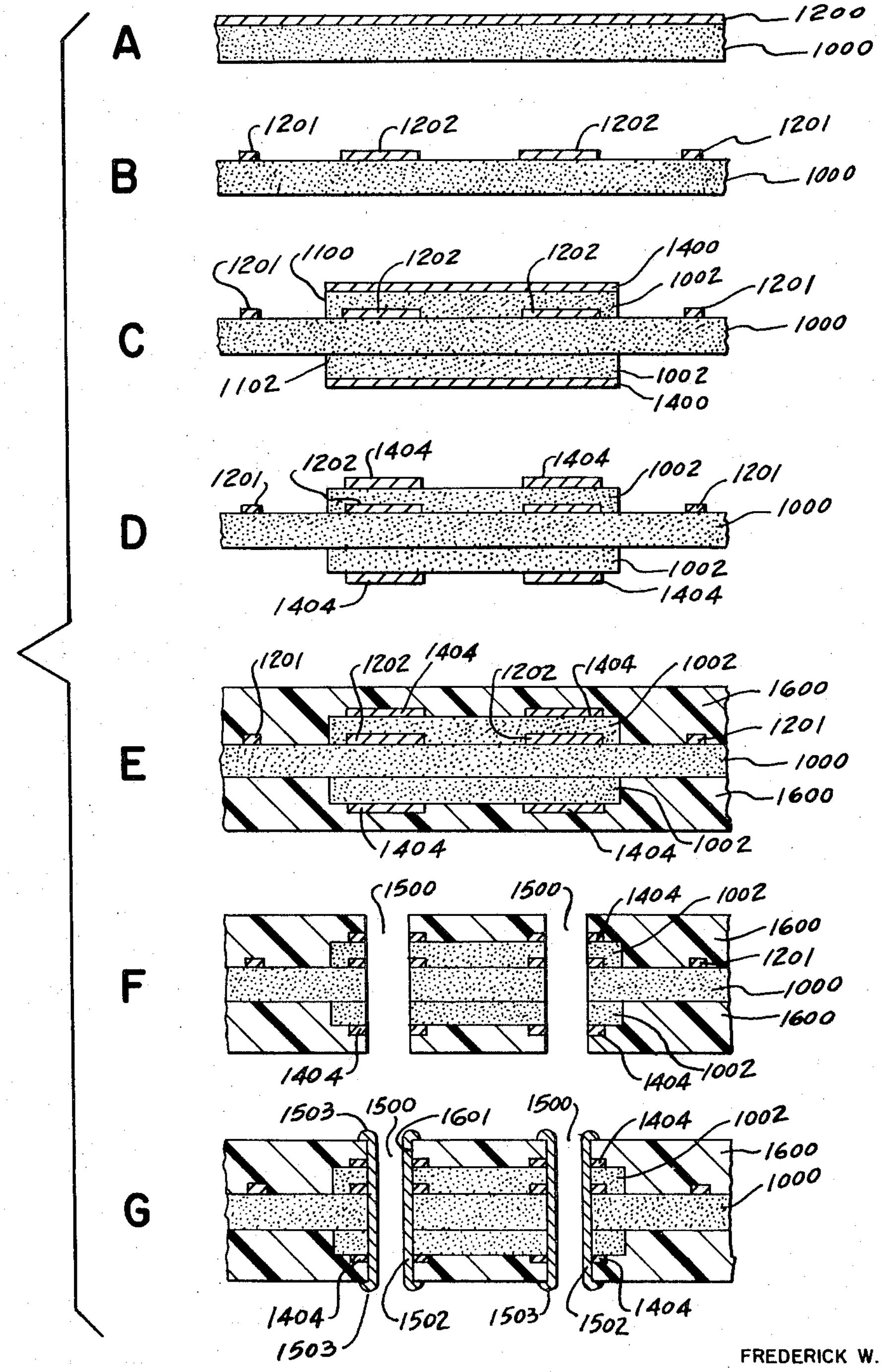

In FIG. 22 is shown still another way in which multilayer plated through hole boards could be used utilizing the non-registered solder mask concept described hereinabove. In FIG. 22A is shown a blank comprising a catalytic base 1000 having superimposed thereon a thin metal film 1200.

In FIG. 22B, a printed circuit pattern 1202 has been formed on the catalytic base 1000 utilizing a print and etch technique.

In FIG. 22C, there has been superimposed upon the circuit pattern 1202 a catalytic blank 1100 comprising a catalytic base 1002 and a thin metal film 1400. A similar catalytic blank 1102 has been superimposed on the bottom layer of the catalytic base 1000 as is also shown in FIG. 22C. In FIG. 22D, additional circuit patterns 1404 have been formed on the top and bottom catalytic base layers 1002 using a print and etch technique. As shown in FIG. 22E, the circuit pattern top and bottom is next coated with a non-registered solder mask 1600. Next, holes 1500 are provided in the circuit board as shown in FIG. 22F. Finally, the board is subjected to an electroless metal deposition solution to deposit electroless metal 1502 on the walls surrounding holes 1500, as shown in FIG. 22G, and to form exposed lands or pads 1601 having the characteristics and functions heretofore described.

The finished circuit board could then be solder plated, for example, by immersing in a solder bath to coat the walls of holes 1500 and pads 1503 with solder.

In a further refinement of the embodiment shown in FIG. 22, suitable indicia at 1201 could be superimposed or provided on the base 1000, preferbaly prior to lamination of the metal clad blanks shown boardly at 1100 and 1102. These indicia could then be used as bull's eyes for pattern registration during printing of the circuit patterns on metal layers 1400. The bull's eyes 1201 may take a variety of forms. Thus, for example, they could be holes bored or otherwise provided in the base 1000 which could serve as a ground plane or a support for an actual circuit pattern, or both. Alternatively, bull's eyes 1201 could take the form of a metal spot or dot produced either by the print and etch or additive technique described herein. Typically, the bull'e eyes 1201 will be cut or sheared off following completion of the board.

It should also be brought out that the initial circuit pattern 1202 need not be formed on the ground plane or base 1000 by print and etch techniques. Similarly, the metal clad blanks 1100 and 1102 in FIG. 22 could if desired be replaced simply by a catalytic base, following which the circuit patterns 1404 could be made by the additive technique rather than the print and etch.

Figure 23:
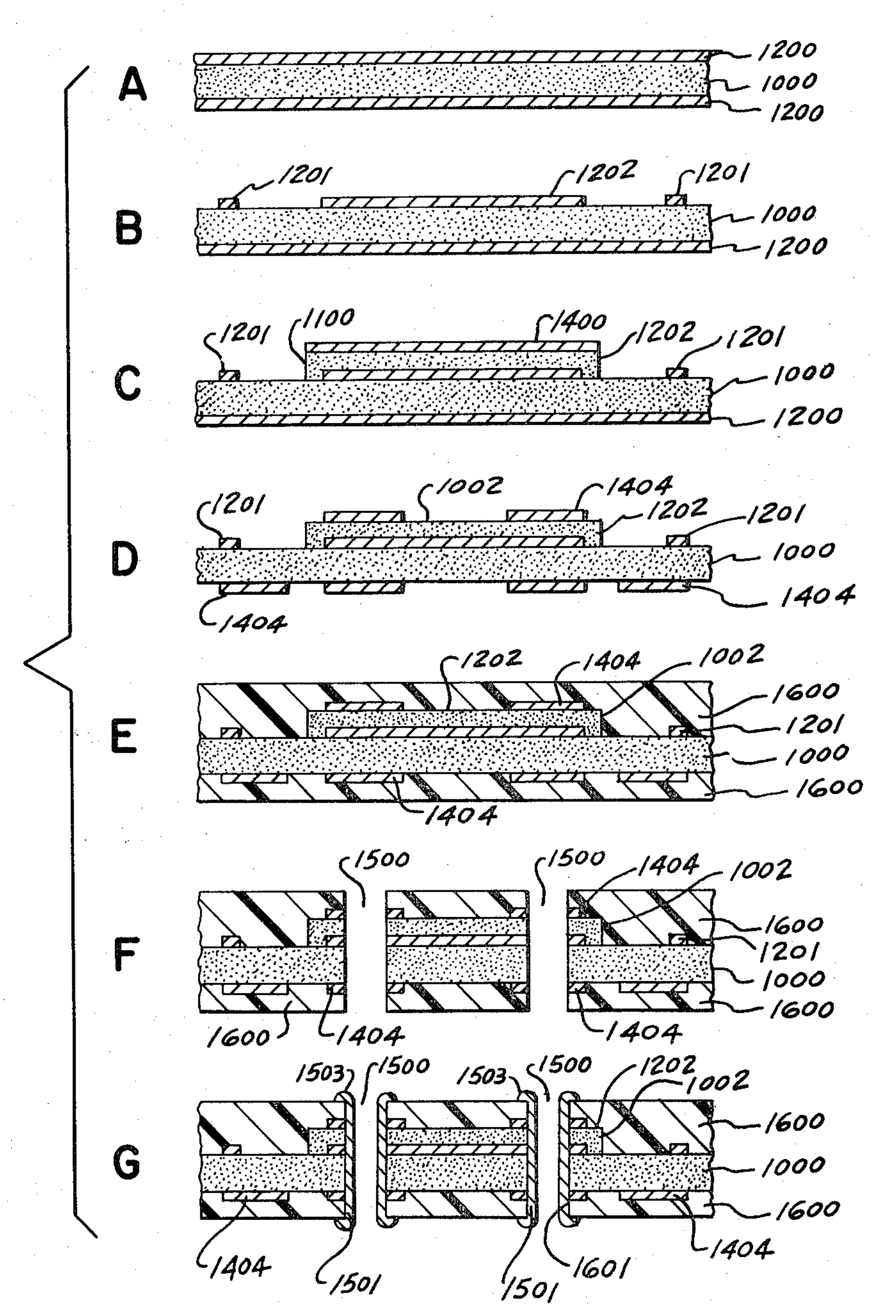

In FIG. 23 is shown still a further embodiment for producing multi-layer boards utilizing the non-registered printed solder mask concept.

In FIG. 23A is shown a blank comprising a catalytic base 1000 having superimposed on both surfaces thin metal films 1200.

Using a print and etch technique, a circuit or ground pattern 1202 is formed on the base 1000. Here again, if desired, bull's eyes or registration marks 1201 may be formed on the base 1000 simultaneously with production of the first printed circuit or ground pattern 1202. In FIG. 23C a catalytic blank 1100 comprising a catalytic base 1000 and a thin metal film 1400 has been superimposed on circuit pattern 1202 and laminated to the catalytic base 1000.

Using print and etch techniques, a circuit pattern 1404 is formed on the surface of base 1002 and on the lower surface of ground base 1000 as shown in FIG. 23D. In FIG. 23E, a nonregistered mask 1600 is laminated or otherwise superimposed on circuit pattern 1404 so that the resulting three-layered board appears as shown in FIG. 23E.

In FIG. 23F holes 1500 are provided in the board, following which the board is subjected to an electroless metal deposition solution to deposit metal on the walls surrounding the holes. The finished three-layer circuit board is shown in FIG. 23G, wherein 1501 refers to the metal surrounding the walls of the holes. Here again, note the presence of lands or pads 1503 to insure good solder joints.

In FIG. 23, circuit pattern 1202 need not be formed by the print and etch technique. Rather, it could be formed by the additive process described herein. Similarly, blank 1100 need not be a metal clad blank but could simply consist of a catalytic base. In such an embodiment, circuit patterns 1404 could also be produced by the additive technique.

Figure 24:
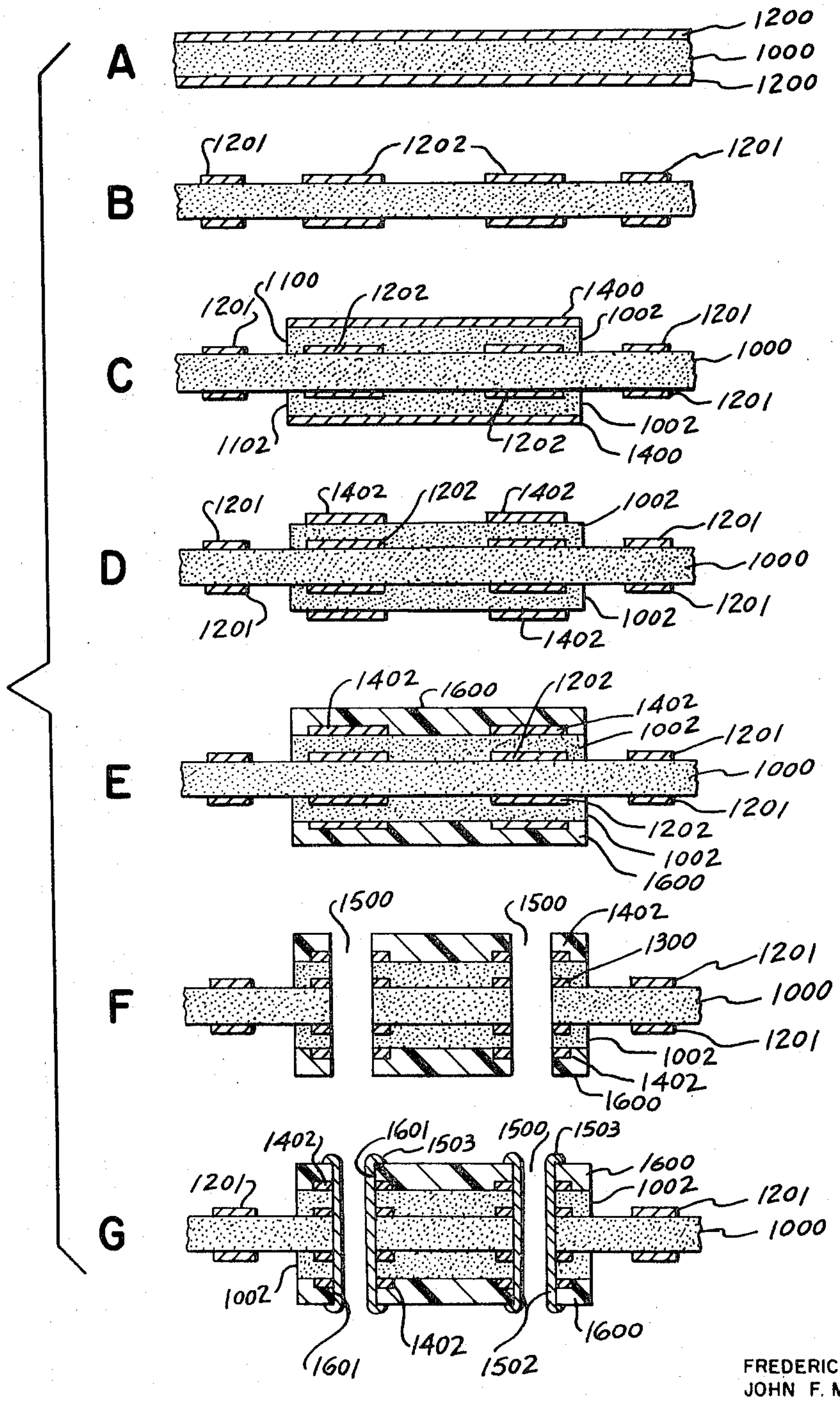

In FIG. 24 is shown a particularly important embodiment of the invention wherein a four-layer plated through hole circuit board containing a non-registered solder mask is produced. In FIG. 24A is shown a blank comprising a base 1000 having superimposed thereon thin metal films 1200. In FIG. 24B, print and etch circuit patterns 1202 are formed on the top and bottom layer of the ground plane 1000. At C, blanks 1100 and 1102 are laminated top and bottom to the base 1000 and cover the circuit patterns 1202. Blanks 1100 and 1102 comprise a catalytic base 1002 and a thin metal film 1400.

In FIG. 24D, additional circuit patterns 1402 are formed top and bottom by print and etch techniques. Here again, bull's eyes or registry marks 1201 may be used if desired for registration purposes in forming the circuit patterns 1402. In FIG. 24E, a non-registered solder mask 1600 is laminated or otherwise coated over both the top and bottom surfaces of the board.

Next, holes 1500 defining cross-over points are provided in the board shown in FIG. 24F. Then the board is subjected to electroless metal deposition to deposit metal in the walls surrounding the holes and to form exposed eyelets 1503, as shown in FIG. 24G. Here again, in the FIG. 24 embodiment, it is not necessary to form the circuit patterns 1402 and 1202 by print and etch techniques. Rather, each of these circuit patterns could be produced using the additive technique described herein. In such embodiments, the metal cladding 1200 and 1400 would be eliminated.

Figure 25:
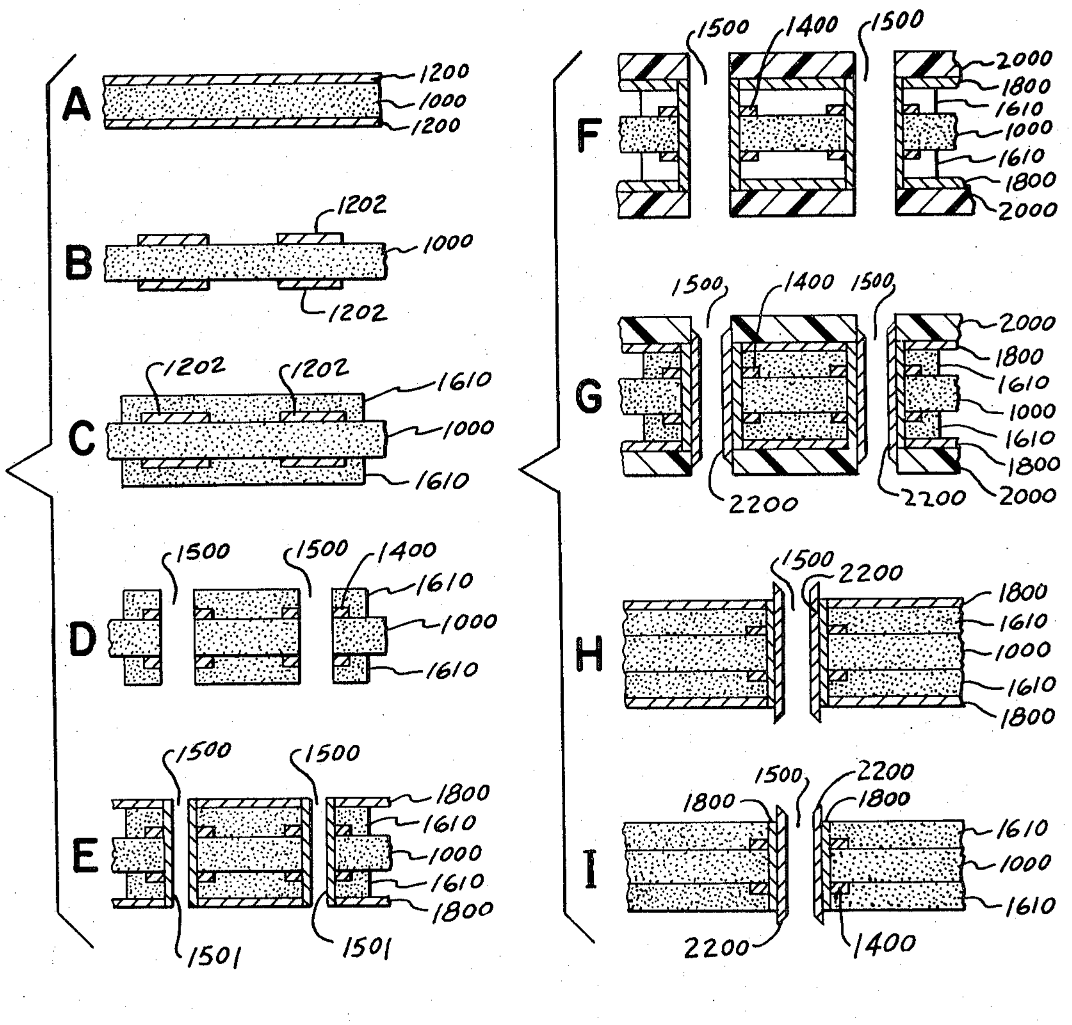

In FIG. 25 is shown still another embodiment of the invention. In FIG. 25A is shown a blank which consists of a catalytic base 1000 having superimposed on each surface a thin metal film 1200. In FIG. 25B using the print and etch technique, circuit patterns 1202 are superimposed on both surfaces of the catalytic base 1000. At FIG. 25C, a catalytic blank or catalytic adhesive 1610 is superimposed on conducting patterns 1202. Here, the layer 1610 will eventually become the non-registered solder mask. In FIG. 25D, holes 1500 are provided in the resulting circuit board. In FIG. 25E, the entire board is subjected to a electroless metal deposition solution to deposit an electroless metal film 1800 over the entire surface of mask 1610 and on the walls 1501 surrounding the holes 1500. Note in this connection that since mask 1610 is catalytic, metal will deposit on the exposed surface of the mask as well as on the walls surrounding the holes when the circuit board in FIG. 25D is exposed, as by immersion, to an electroless metal deposition solution. In FIG. 25F, a non-permanent resinous mask 2000 is superimposed on and coats the upper and lower surfaces of the board leaving the holes 1500 exposed. Next, the board may be subjected to electroplating to build up the metal deposit on the walls surrounding the holes as shown in 2200 in FIG. 25G. Then, the non-permanent mask 2000 is stripped to produce a board shown at FIG. 25H. Finally, the thin electroless film of metal 1800 is removed by subjecting the panel to a quick etch. The final board has the appearance as shown in FIG. 25I. Here it will be noted that the permanent resin mask 1610 coats the entire surface on the top and bottom of the board leaving only the plated through hole 1500 exposed.

In the FIG. 25 embodiment, as will be clear, the circuit patterns 1202 could be formed by the additive technique rather than the print and etch.

Figure 26:
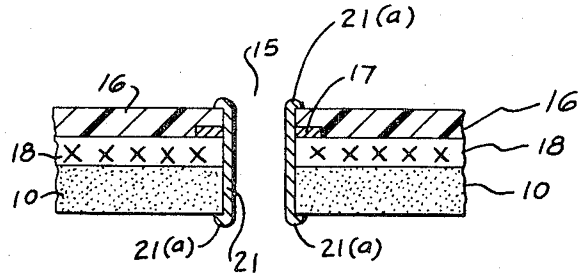
Figure 27:
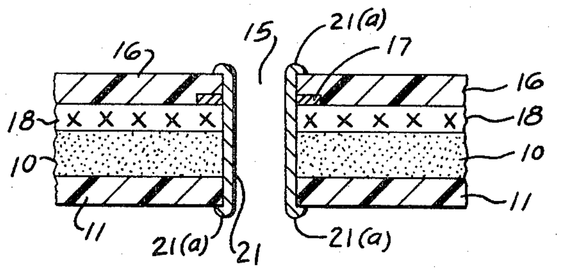
Figure 28:
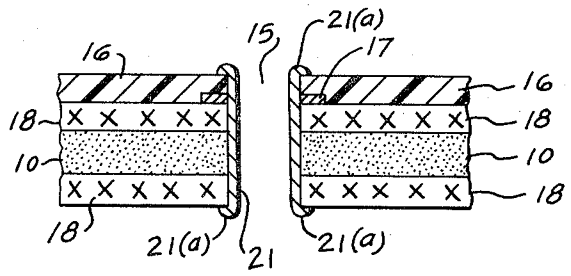

The embodiments of FIGS. 26–28 may be produced by using blanks of the type shown in FIGS. 1–12.

Thus, for example, the blank of FIG. 10 wherein a catalytic adhesive 18 is superimposed on a catalytic base 10 could be used to produce the one-sided plated through hole board having a non-registered solder mask shown in FIG. 26. In FIG. 26, 10 is a catalytic base and 18 is a catalytic adhesive superimposed on the base. Numeral 17 represents the conductor pattern and 16 represents the solder mask. In FIG. 26, the wall of hole 15 has a deposit of metal 21 to make a plated hole. Note that the plating on the hole wall extends over the edge of the board at the upper and lower surfaces to form small exposed eyelets 21(*a*).

In FIG. 27 is shown a plated through hole board formed from the blank of FIG. 7 utilizing the non-registered resin mask concept. In FIG. 27, the board comprises a catalytic base 10, the lower surface of which comprises an insulating resinous layer 11. On the upper surface, the base 10 is coated with a layer 18 of catalytic adhesive material on which has been formed the printed circuit pattern 17. A permanent resin mask 16 covers the circuit pattern completely. Hole 15 has its walls covered with metal 21, which extends over the outer surfaces of masks 16 and 11 to form exposed lands or pads having the characteristics and functions already described.

In FIG. 28 is shown a plated through hole board made from the blank shown in FIG. 11. The board of FIG. 28 comprises a catalytic base 10 having superimposed thereon layers of catalytic adhesive 18. Printed circuit pattern 17 is formed on the upper surface of adhesive 18. Permanent solder mask 16 covers the entire circuit pattern. Hole 15 has a plated wall 21, which creeps over the upper and lower surfaces of the board.

In FIGS. 26 through 28, additional circuit patterns could be imposed on the lower surface as well as the upper surface of the base following the techniques described herein.

Figure 29:
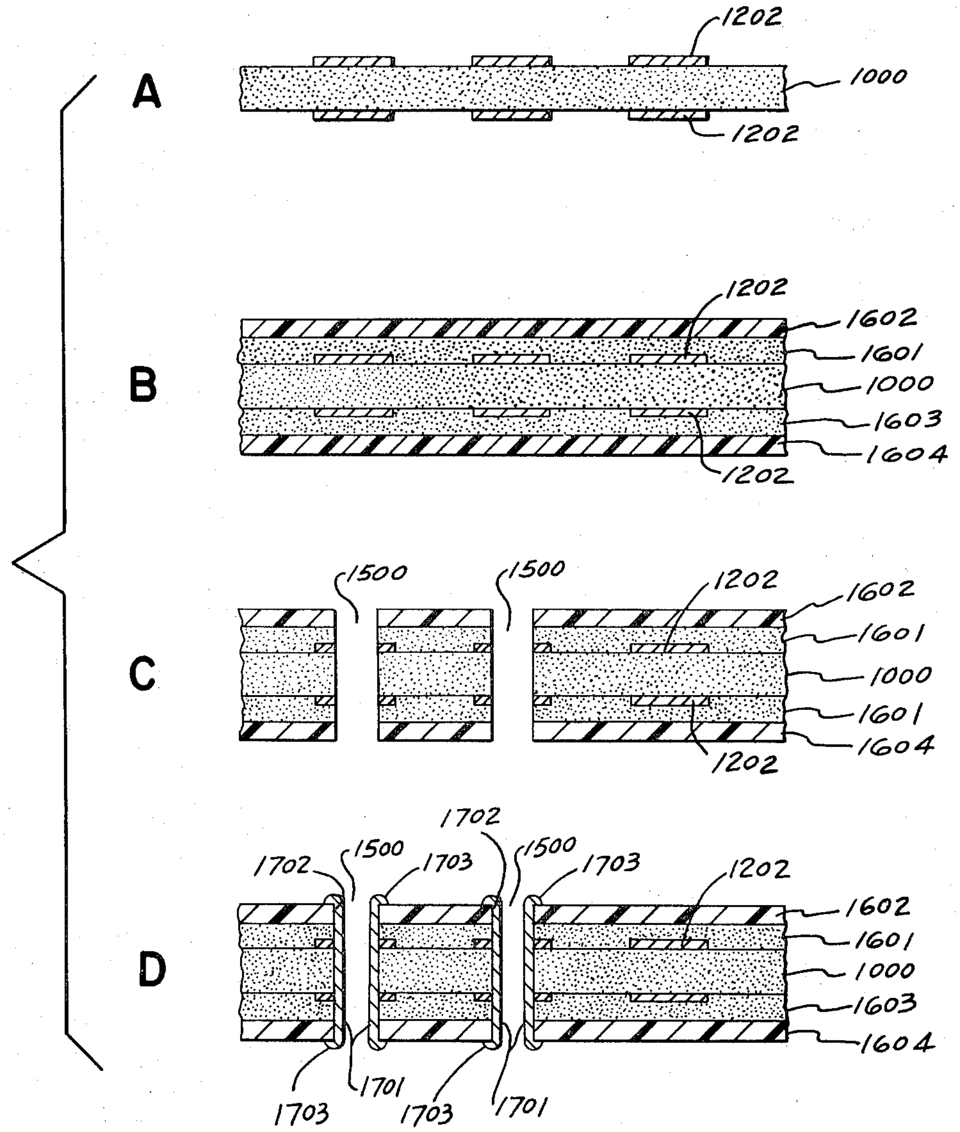

In FIG. 29 is shown still another embodiment of the invention utilizing the non-registered mask technique. According to this embodiment, a printed circuit pattern 1202 is formed on both faces of the catalytic base material 1000 as shown in FIG. 29A. The circuit patterns 1202 may be formed by the additive technique described hereinabove, i.e., by the deposition of electroless metal on the catalytic base 1000, or they may be formed by a print and etch technique, i.e., by printing and etching a metal foil adhered to the catalytic base 1000. Next, catalytic layers 1601 and 1603 are superimposed on the printed circuit pattern 1202 as shown in FIG. 29B. The catalytic layers 1601 and 1603 may be imposed upon the printed circuit patterns by painting a suitable catalytic ink or resin, by laminating a film of catalytic material or by any of the other suitable techniques described herein. Superimposed on the catalytic layers 1601 and 1603 are layers 1602 and 1604 of a non-catalytic resinous material. In this embodiment, the non-registered masks comprise the combination of the catalytic layers (1601 and 1603) with the non-catalytic resins (1602 and 1604). Next, as shown in FIG. 29C, holes are provided in the resulting board. Finally, the panel is exposed to an electroless metal deposition solution to deposit electroless metal on the walls surrounding the holes as shown in FIG. 29D. Note that the metal layer 1701 in the holes grows over masks 1602 and 1604 to form lands or pads 1703.

To place the printed circuit boards of this invention in proper prospective, it should be pointed out that whenever distance between hole centers in plated through hole printed circuit boards is 0.25 inch or less, mechanical printing techniques break down, so that when high density circuit patterns are desired having hole center spacing of 0.25 inch or less, photoprinting techniques will ordinarily be used. It is exactly on such high density boards that lands surrounding the holes which are coplanar with the conductors forming the circuit patterns cause the difficulties described above. The non-registered solder mask concept for producing plated through holes described herein are therefore particularly applicable to manufacture of printed circuit boards having plated through holes whose centers are spaced apart 0.25 inch or less, i.e., between about 0.001 to 0.25 inch; and particularly between 0.005 and 0.1 inch.

In those uses where solderability is not required, circuit boards having the ingress and egress hole structures depicted in FIGS. 16 and 18 may be used. Such structures are entirely landless, it will be noted, and therefore permit the maximum circuit density to be utilized.

The process for making multi-layer printed circuit structures described herein is suitable for making armatures as used in printed circuit motors of the general type described in Henry-Baudot Pat. No. 3,144,574, the description of which is hereby incorporated herein by reference. These armatures include a permanent magnet stator structure which provides a planar, annular array of pole faces of alternating magnetic polarities.

As will be clear from the foregoing, the circuit boards of this invention may be solder plated for connection to lugs and components, for example, by immersion in a molten solder bath to coat the plated walls of the holes and the exposed eyelets or pads, where present, with solder. When circuit boards provided with the non-registered solder masks of this invention are subjected to a solder bath, solder deposits only on the electroless metal deposit on the walls surrounding the holes. The insulating non-registered masks insure that no solder deposits on the surface of the circuit board itself.

It should be emphasized that in making the prefabricated circuit boards of this invention, it is not necessary to build up the plating on the wall holes or the circuit pattern itself entirely by electroless deposition. Thus, if desired, the hole wall and/or circuit pattern could be initially but partially formed by electroless metal deposition, after which the initial electroless deposit could be built up to a desirable thickness by electroplating of the same or a different metal.

With the blanks which contain a metal film bonded to the surface, electroplating following electroless deposition is entirely feasible. If desired, the metal film on the surface could be masked following electroless metal deposition. After electroplating, if desired, the mask could be stripped from the surface and the metal surface film, if sufficiently thin, could be subjected to a quick etch operation to remove it.

Also, it should be brought out that when the blanks of the type described in FIGS. 5 and 9–11 are subjected to an electroless deposition solution, as by immersion, electroless deposition will occur not only on the walls surrounding the holes but also on the exterior surfaces of the boards, since as has been brought out, the entire insulating base in this embodiment is catalytic to the reception of electroless metal. A suitable acid or oxidation treatment of the type described supra may be needed to open up the surface portion of the blank. Accordingly, following the laying down of uniform coating of electroless metal uniformly on the wall holes and on the exterior surfaces of the blank, the copper on the hole walls could be built up if desired by electroplating. Here again, the metal contained on the surface of the board could be masked prior to electroplating, following which the mask could be removed and the surface film of metal removed by a quick etching operation, following electroplating.

It should also be brought out that the catalytic inks described herein could be used to produce printed circuit patterns by printing a positive design of the pattern on non-catalytic surfaces, and then subjecting the base to electroless metal deposition. These catalytic inks have the advantage of being non-conductive as already brought out. As between the catalytic and non-catalytic insulating bases described, the catalytic bases are preferred, as already brought out.

If desired, the base material used for the boards of this invention need not be catalytic. In this embodiment, the walls of the holes, following formation, must be suitably treated to sensitize them to the electroless deposition of metal. Thus, the lateral walls surrounding the holes could be seeded or sensitized by sequential treatment with aqueous solutions of stannous tin ions, or amine boranes, e.g., dialkyl amine boranes, such as dimethylamine borane, morpholine borane, isopropylamine borane, and the like, or alkali borohydrides, such as sodium or potassium borohydride, followed by or preceded by treatment with an aqueous solution of precious metal ions, e.g., palladium. For example, one such treatment involves immersing the perforated insulating, non-catalytic base material first in an aqueous solution of stannous chloride, followed by washing, after which the substratum is immersed in an acidic aqueous solution of palladium chloride. Seeding and sensitizing may also be accomplished by soaking the non-catalytic insulating base material in a single aqueous solution comprising a mixture of stannous tin ions and precious metal ions, such as palladium ions, as described in U.S. Pat. 3,001,920. The precious metals which may be used in seeding include platinum, gold, rhodium, osmium and iridium, in addition to palladium. Mixtures of such precious metals may also be used.

Examples 11–14 illustrate typical seeder-sensitizer systems of the type described and their method of operation. These systems may be used to render non-catalytic surfaces of insulating bases, including walls surrounding holes in such bases, catalytic to the reception of electroless metal.

Example 11

An insulating, non-catalytic resinous base is rinsed and soaked in an acidified stannous chloride solution having the following composition:

| | Grams |
|---|---|
| Stannous chloride | 50 |
| Hydrochloric acid (12 N) | 30 |
| Water, enough to make 1 liter. | |

The soak in stannous chloride is continued for 10 minutes, and is followed by a rinse first in dilute hydrochloric acid and then in water. The base is then soaked in the following palladium chloride solution for 2 minutes:

| | | |
|---|---|---|
| Palladium chloride | g./l. | 20 |
| Hydrochloric acid (12 N) | ml./l. | 20 |
| Water | | Remainder |

After thorough rinsing, the base is ready for electroless copper deposition.

Example 12

The insulating, non-catalytic resinous base is rinsed and soaked for a suitable period of time, e.g., up to 10 minutes, in an aqueous solution comprising 1–2.5 grams/liter of dimethylamine borane, morpholine borane, or isopropylamine borane. Following rinsing, the base is then soaked in the following palladium chloride solution for about 2 minutes:

| | | |
|---|---|---|
| Palladium chloride | gram/liter | 0.1 |
| HCl (37%) | ml./l. | 20–30 |
| Triton X-100 [1] | ml./l. | 0.5–1 |
| Water, to make 1 liter. | | |

[1] An ethylene oxide adduct of octyl phenol.

After thorough rinsing in water, the surface of the base, including the walls surrounding holes in the base, will be receptive to the reception of electroless copper.

If desired, in practicing this example, the order of treatment could be reversed, i.e., the base could first be treated with the palladium chloride solution, followed by treatment with any of the borane solutions described.

Example 13

The insulating, non-catalytic resinous base is soaked in the following solution:

| | |
|---|---|
| Sodium borohydride | 5 grams/liter. |
| NaOH | Enough to give a pH of 13. |
| Water | To make 1 liter. |

After thorough rinsing, the base is soaked in the solution of palladium chloride described in Example 12. Here again, the treatment with the palladium chloride solution could precede the borohydride solution treatment, if desired.

Example 14

The insulating, non-catalytic resinous base, following cleaning, is soaked in a one-part seeder-sensitizer comprising:

| | | |
|---|---|---|
| Stannous chloride | grams/liter | 70 |
| Palladium chloride | gram/liter | 1 |
| HCl (37%) | ml./l. | 200–300 |
| Water, to make 1 liter. | | |

After thorough rinsing in water, the surface of the base, including the walls of any holes in the base, will be receptive to the deposition of electroless metal.

Figure 30:
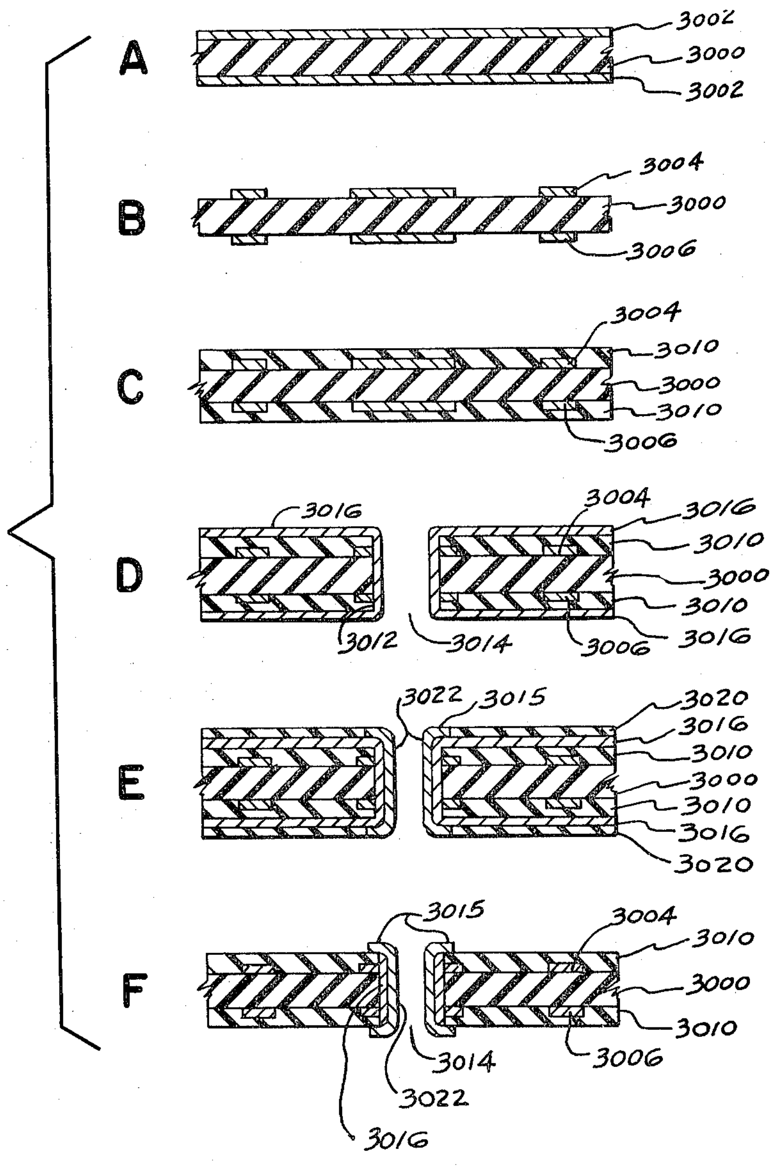

FIG. 30 illustrates a preferred procedure for manufacturing printed circuit boards of the type depicted in FIG. 25 from non-catalytic base materials using seeding and sensitizing systems of the type described.

In FIG. 30A is shown a non-catalytic insulating base 3000 clad on both sides with a thin metal film 3002. In FIG. 30B, circuit patterns 3004 and 3006 have been imposed on the base by standard print and etch techniques. In FIG. 30C, relatively thick, permanent, non-registered solder masks 3010 have been superimposed on each of the circuit patterns 3004 and 3006.

Next, holes 3014 (FIG. 30D) defining cross-overs are provided in the base and the base is treated as described, for instance, in any of Examples 11 to 14 to render the exterior surfaces of the masks 3010 and the wall 3012 of the hole 3014 catalytic to the reception of electroless metal. Next, the base is exposed to an electroless metal solution to deposit a thin film of electroless metal 3016 on the exterior surfaces of masks 3010 and on the walls 3012 of the holes, as shown at FIG. 30D. Next, a thin, non-permanent registered mask 3020 is superimposed on the exposed surfaces of the board, leaving the holes exposed. The base is then subjected to electroplating to build up a metal deposit 3022 on the walls surrounding the holes and lands 3015, as shown in FIG. 30E. Finally, the non-permanent resinous mask 3020 is stripped, and the base subjected to a quick etch to remove from the surface of the base the thin, electroless deposit 3016. The final board has the appearance shown in FIG. 30F. It will be noted that the permanent resin mask 3010 coats the entire surface on the top and bottom of the board, leaving only the plated through hole 3014 with surrounding lands 3015 exposed.

In an alternative procedure, the thickness of plating on the hole wall could, if desired, be built up entirely by electroless deposition.

Using the seeding and sensitizing systems and the quick etch procedure described, circuit boards of the type depicted in the remaining drawings may be prepared from non-catalytic base stock.

The following is a typical specific procedure which may be used in practicing the process illustrated in FIG. 30:

(1) Print and etch non-catalytic base stock copper clad on both sides;
(2) Remove resist;
(3) Apply a permanent epoxy mask to both surfaces of the base;
(4) Drill all holes;
(5) Immerse base in concentrated $H_2SO_4$ for about 30 seconds;
(6) Neutralize in Altrex solution for about 1 minutes;
(7) Immerse in hydrochloric acid solution for about 2 minutes;
(8) Seed and sensitize per Example 14;
(9) HCl dip;
(10) Immerse in electroless copper solution for about 30 minutes;
(11) Blank screen non-permanent Warnow Blue resist on both sides, leaving only the holes to be plated. Base 30 minutes at 256° F.;
(12) Electroplate holes to desired thickness;
(13) Strip non-permanent resist;
(14) Quick etch electroless copper on exposed surfaces of the base;
(15) Bake dry 130° C. for 30 minutes.

Prior to step (9), the glazed epoxy surface should be removed so that the electroless copper film will not blister. Scrubbing with a brass brush will accomplish such a result.

Figure 31:
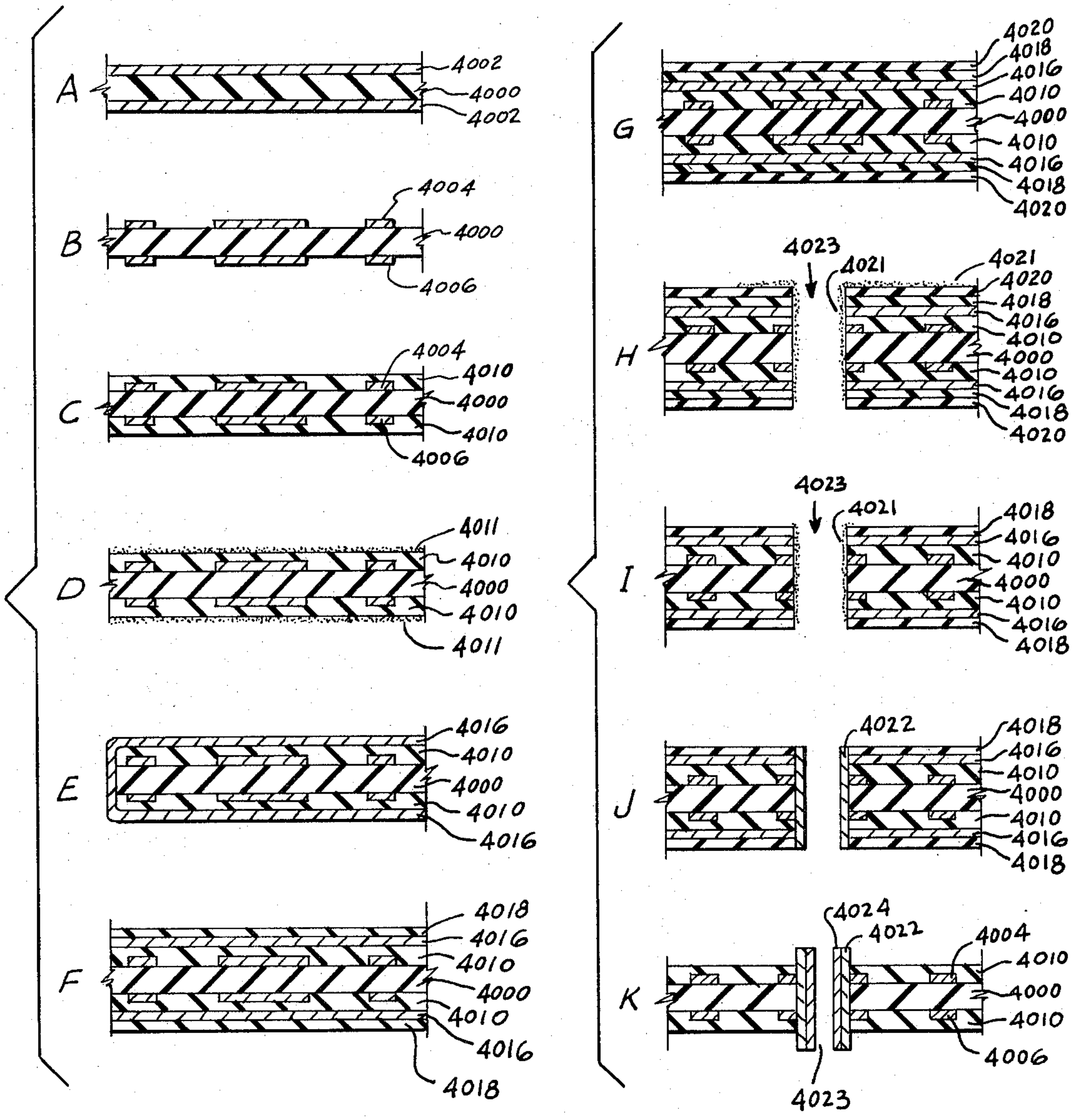

FIG. 31 illustrates another preferred procedure for manufacturing printed circuit boards of the type depicted herein from non-catalytic base materials using seeding and sensitizing systems of the type described.

In FIG. 31A is shown a non-catalytc insulating base 4000 clad on both sides with a thin metal film 4002. In FIG. 31B, circuit patterns 4004 and 4006 have been imposed on the base by standard print and etch techniques. In FIG. 31C, relatively thick, permanent, non-registered solder masks 4010 have been superimposed on each of the circuit patterns 4004 and 4006.

Next, the base is treated as described, for instance, in any of Examples 11 to 14 to render the exterior surfaces of the masks 4010 catalytic to the reception of electroless metal, as shown at 4011, FIG. 31D. Next, the base is exposed to an electroless metal solution to deposit a thin film of electroless metal 4016 on the exterior surfaces of masks 4010, as shown at FIG. 31E. Next, a first, thin, non-permanent and preferably strippable mask 4018 is superimposed on the exposed surfaces of the board as shown at 4018, FIG. 31F. Next, a second, thin, preferably strippable mask 4020 is superimposed on the first mask 4018. See FIG. 31G. Then holes 4023 defining cross-overs are provided in the base by any suitable means. See FIG. 31H. Next, the base is treated, as described for instance, in any of Examples 11 to 14 to render the walls surrounding the holes and the exposed surface of masks 4020 catalytic to the reception of electroless metal, as shown at 4021, FIG. 31H. The temporary mask 4020 is then stripped, to produce the base depicted at FIG. 31I. The base is then subjected to electroless metal deposition to produce a thin electroless metal deposit 4022 on the wall of hole 4023. See FIG. 31J. The base is then subjected to electroplating to build up a metal deposit 4024 on the walls surrounding the holes. Finally, the non-permanent resinous mask 4018 is stripped, and the base subjected to a quick etch to remove from the surface of the base the thin, electroless deposit 4016. The final board has the appearance shown in FIG. 31K. It will be noted that the permanent resin mask 4010 coats the entire surface on the top and bottom of the board, leaving only the plated through hole 4023 with surrounding lands 4022–4024 exposed.

In an alternative procedure for making the boards depicted in FIG. 31, a thin metal foil, such as a copper or an aluminum foil, could be laminated to the permanent resin mask 4010 following the step depicted in FIG. 31C. This would eliminate the necessity of the seeding and sensitizing step, FIG. 31D, and the electroless deposition step, FIG. 31E. In this alternative, the remaining procedure, steps F to K of FIG. 31, would be the same as described above.

The procedure of FIG. 31 could also be used to manufacture the new and novel printed circuit boards described herein using catalytic base material. Such a modification is shown in FIG. 32.

In FIG. 32A is shown a blank which consists of a catalytic base 5000 having superimposed on each surface a thin metal film 5004 in the form of a circuit pattern. At FIG. 32B, a permanent, non-catalytic resin mask 5010 is superimposed on conducting patterns 5004. Here, the layer 5010 will eventually become the non-registered solder mask. In FIG. 32C, the base is treated as described supra, for instance in Examples 11 to 14 to render the exterior surfaces of masks 5010 catalytic to the reception of electroless metal as shown at 5011, FIG. 32C. In FIG. 32D, the entire board is subjected to an electroless metal deposition solution to deposit an electroless metal film 5016 over the entire surface of masks 5010. In FIG. 32E, a non-permanent, preferably strippable, resin mask 5018 is superimposed on electroless metal layers 5016. In FIG. 32F, holes 5023 are provided in the resulting circuit board. Since base 5010 is catalytic, electroless metal will deposit on the walls thereof surrounding the holes 5023 when the circuit board in FIG. 32F is exposed, as by immersion, to an electroless metal deposition solution. Next, the base is exposed to electroless metal solution to deposit electroless metal 5022 on the hole walls as shown at FIG. 32G. Next, the board may be subjected to electroplating to build up the metal deposit on the walls surrounding the holes as shown in 5024 in FIG. 32H. Then, the non-permanent mask 5018 is stripped. Finally, the thin electroless film of metal 5016 is removed by subjecting the panel to a quick etch. The final board has the appearance as shown in FIG. 32I. Here it will be noted that the permanent resin mask 5010 coats the entire surface on the top and bottom of the board leaving only the plated through hole 5023 exposed.

Figure 32:
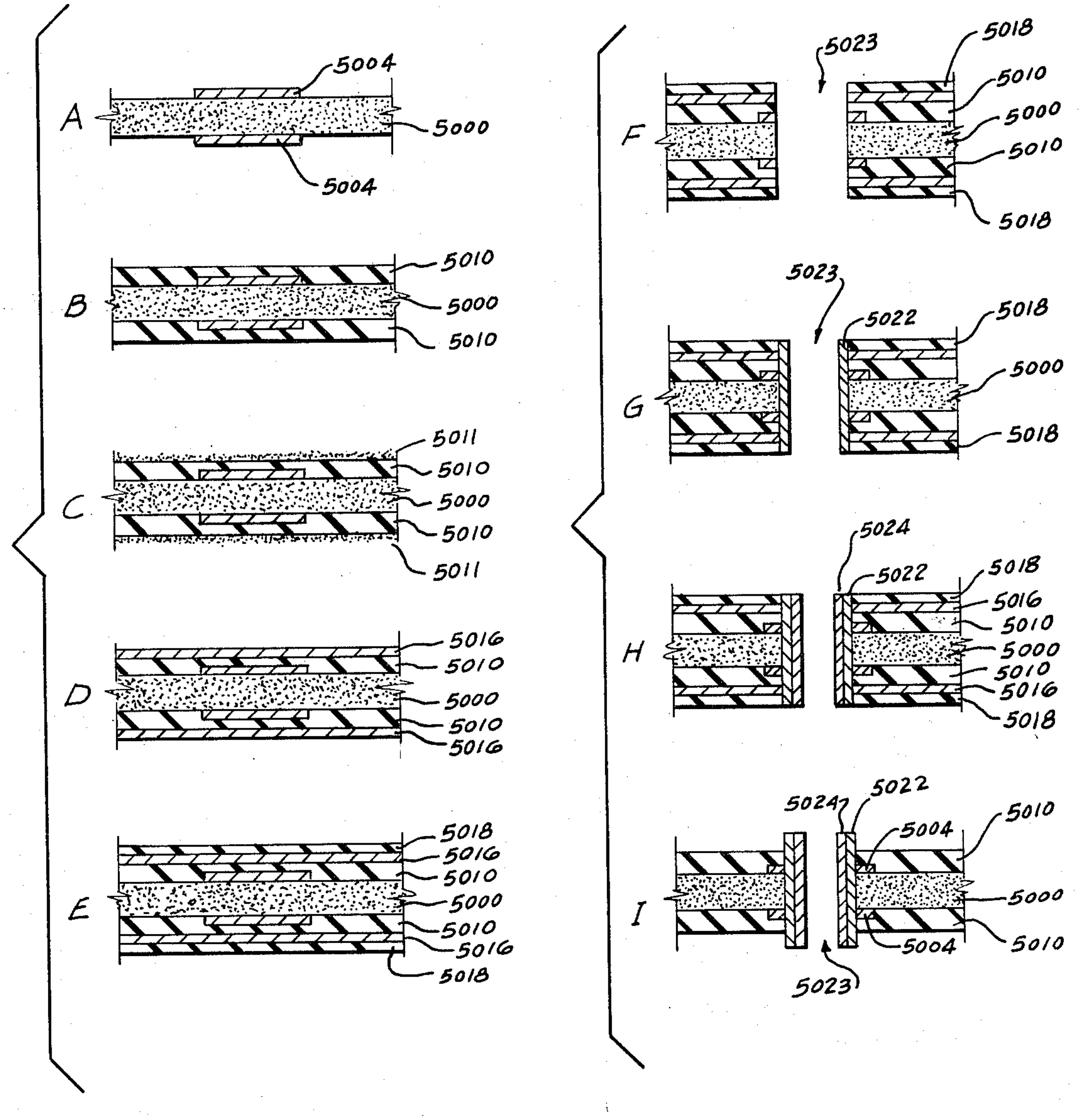

In the FIG. 32 embodiment, as will be clear, the circuit patterns 5004 could be formed by either the additive or the print and etch technique.

In a modification of the FIG. 32 embodiment, a thin metal foil, such as a copper or aluminum foil, could be laminated to the permanent resin mask 5010 following the step depicted in FIG. 32B. This would eliminate the necessity of the seeding and sensitizing step, FIG. 32C, and the electroless deposition step, FIG. 32D. In this alternative, the remaining procedure, steps E to I, would be the same as described above.

Also, in the FIG. 32 embodiment, the permanent resin mask 5010 could be a catalytic adhesive, thereby eliminating the necessity of seeding and sensitizing, FIG. 32C, prior to imposing the electroless metal layer 5016, FIG. 32D. Further, if desired, the non-permanent mask 5018 could be a catalytic mask.

The invention in its broader aspects is not limited to the specific steps, methods, compositions and improvements shown and described herein, but departures may be made within the scope of the accompanying claims without departing from the principles of the invention.

What is claimed:

1. In a method of manufacturing plated through hole printed circuit boards that include an insulating base having a printed circuit pattern on one surface, the improvement which comprises coating the circuit pattern with a permanent, non-registered insulating mask covering a portion of the circuit pattern, forming a hole through the insulating mask and the printed circuit pattern and into the interior of the insulating base, and metallizing the wall surrounding the hole to form a continuous metal deposit spanning the circuit pattern and extending to a location near the surface of the mask.

2. The method of claim 1 wherein the insulating base is catalytic throughout its interior to reception of electroless metal and wherein the metallizing occurs by exposing the base to an electroless metal deposition solution.

3. The method of claim 2 wherein the hole wall is electroplated with metal following electroless metal deposition.

4. The method of claim 1 wherein the surface of the base and insulating mask surrounding and forming the hole wall are treated with an aqueous solution of precious metal ions to render them catalytic to the reception of electroless metal prior to metallizing the hole wall, and wherein said metallization is achieved by contact of the resulting catalytic surfaces to an electroless metal deposition.

5. The method of claim 4 wherein the hole wall is electroplated with metal following electroless metal deposition.

6. The method of claim 4 wherein the catalytic treatment additionally includes a treatment with a solution comprising a member selected from the group consisting of stannous tin ions, amine boranes, and alkali borohydrides.

7. In a method of manufacturing plated through hole printed circuit boards which comprises establishing an insulating base having a printed circuit pattern on one surface, the improvement which comprises coating the circuit pattern with a permanent, non-registered insulating mask, establishing a thin layer of metal on the surface of said permanent mask, superimposing a non-permanent mask on the thin layer of metal, providing at least one hole in the base, the wall surrounding said base comprising a portion of said insulating base, depositing a thin layer of electroless metal on the wall surrounding the hole, electroplating additional metal on said electroless metal deposit on the hole wall, and then removing said non-permanent mask and said thin layer of metal.

References Cited

UNITED STATES PATENTS

| | | | |
|---|---|---|---|
| 3,269,861 | 8/196 | Schneble, Jr., et al. | 117—212 |
| 3,171,756 | 3/1965 | Marshall | 174—68.5 |
| 3,146,125 | 8/1964 | Schneble, Jr., et al. | 117—47 X |
| 2,690,401 | 9/1954 | Gutzeit | 117—160 X |
| 3,268,653 | 8/1966 | McNutt | 117—212 X |
| 3,436,819 | 4/1969 | Lunine | 117—212 X |
| 3,340,607 | 9/1969 | Shutt. | |

DANIEL J. FRITSCH, Primary Examiner

U.S. Cl. X.R.

29—625; 117—47 A, 215, 218; 174—68.5